(12) United States Patent
Park et al.

(10) Patent No.: US 11,073,759 B2
(45) Date of Patent: Jul. 27, 2021

(54) COMPLEX PATTERNING DEVICE AND OPERATION METHOD THEREOF

(71) Applicants: KOREA INSTITUTE OF CERAMIC ENGINEERING AND TECHNOLOGY, Jinju-si (KR); GLOBAL FRONTIER HYBRID INTERFACE MATERIALS, Busan (KR)

(72) Inventors: Woon Ik Park, Jinju-si (KR); Tae Wan Park, Jinju-si (KR); Kwang Ho Kim, Busan (KR)

(73) Assignees: KOREA INSTITUTE OF CERAMIC ENGINEERING AND TECHNOLOGY, Jinju (KR); GLOBAL FRONTIER HYBRID INTERFACE MATERIALS, Busan (KR)

( * ) Notice: Subject to any disclaimer, the term of this patent is extended or adjusted under 35 U.S.C. 154(b) by 70 days.

(21) Appl. No.: 16/515,658

(22) Filed: Jul. 18, 2019

(65) Prior Publication Data
US 2020/0371433 A1 Nov. 26, 2020

(30) Foreign Application Priority Data
May 21, 2019 (KR) .................. 10-2019-0059301

(51) Int. Cl.
*G03F 7/00* (2006.01)
*B29C 33/42* (2006.01)
*B05C 5/00* (2006.01)

(52) U.S. Cl.
CPC .............. *G03F 7/0002* (2013.01); *B05C 5/00* (2013.01); *B29C 33/424* (2013.01); *G03F 7/0022* (2013.01); *B29C 2033/426* (2013.01)

(58) Field of Classification Search
CPC .. G03F 7/0002; G03F 7/0022; G03F 7/70691; B29C 33/424; B29C 2033/426;
(Continued)

(56) References Cited

U.S. PATENT DOCUMENTS 8,807,978 B2 * 8/2014 Owa ..................... G03F 7/0002
425/169
2008/0302255 A1 * 12/2008 Koivukunnas ........ B29C 59/046
101/27
(Continued)

FOREIGN PATENT DOCUMENTS

JP 2003080514 3/2003
JP 2009143221 7/2009
(Continued)

OTHER PUBLICATIONS

Ashby, Michael F., and D. Cebon. "Materials selection in mechanical design." Butterworth-Heinermann. 2016. 5th Edition. <https://books.google.com/books?id=K4h4CgAAQBAJ&lpg=PP1&pg=PA537#v=onepage&q&f=false> (Year: 2016).*
(Continued)

*Primary Examiner* — Leith S Shafi
(74) *Attorney, Agent, or Firm* — Finch & Maloney PLLC

(57) ABSTRACT

Provided is a complex patterning device. The complex patterning device includes a patterning module, on which a master substrate including a master pattern that contacts and is separated from a target substrate and which forms a plurality of target patterns having a reverse image of the master pattern on the target substrate by applying a pressure onto the target substrate, and a punching module including a punching mold that contacts and is separated from the target substrate, in which the plurality of target patterns are
(Continued)

formed, and which divides at least any one of the plurality of target patterns by applying a pressure onto the target substrate.

9 Claims, 32 Drawing Sheets

(58) Field of Classification Search
CPC ..... B05C 5/00; B41K 3/68; B26F 1/40; B26F 1/44; B26F 1/405; B26F 2001/4418; B26F 2001/4427
See application file for complete search history.

(56) References Cited

U.S. PATENT DOCUMENTS

| 2011/0120282 A1* | 5/2011 | Benker | B29C 51/445 |
| | | | 83/109 |
| 2011/0162495 A1* | 7/2011 | Sugiyama | G02B 30/56 |
| | | | 83/13 |

FOREIGN PATENT DOCUMENTS

| JP | 54138162 | | 2/2014 |
| JP | 2017-213654 A | | 12/2017 |
| JP | 2017213654 A | * | 12/2017 |
| KR | 1020100027842 | | 3/2010 |

OTHER PUBLICATIONS

Machine Translation of JP-2017213654-A. (Year: 2017).*

* cited by examiner (a)

| $TG_1$ | $TG_2$ | $TG_3$ | $TG_4$ |
|---|---|---|---|
| $TG_5$ | $TG_6$ | $TG_7$ | $TG_8$ |
| $TG_9$ | $TG_{10}$ | $TG_{11}$ | $TG_{12}$ |

COMPLEX PATTERNING DEVICE AND OPERATION METHOD THEREOF

CROSS-REFERENCE TO RELATED APPLICATION

This patent application claims priority under 35 U.S.C. § 119 to Korean Patent Application 10-2019-0059301, filed on 21 May 2019 in the Korean Intellectual Priority Office, the disclosure of which is hereby incorporated by reference in its entirety.

BACKGROUND OF THE INVENTION

1. Field of the Invention

The present invention relates to a complex patterning device and an operation method thereof, and more particularly to a complex patterning device which forms a plurality of target patterns on a target substrate and divides at least any one of the plurality of formed target patterns, and an operation method thereof.

2. Description of the Prior Art

In order to overcome an optical limit of photolithography for fine patterns in excess of a limit resolution of exposure equipment, a process of forming a photosensitive film pattern, heating the photosensitive film pattern to a glass transition temperature of a photosensitive film or more, and reflowing the photosensitive film pattern to form a fine photosensitive film pattern, and a process using a resist enhancement lithography assisted by chemical shrink (RELACS) have been used.

However, in the photosensitive film reflow or the RELACS process, it is almost impossible to form a fine pattern of a level of 30 nm due to a limit of resolution and a decrease of the volume of the photosensitive film. Accordingly, various fine pattern forming methods and devices for solving the above-mentioned problems have been researched and developed. For example, Korean Patent No. 10-1000715 (Application No. 10-2008-0086923, Applicant: Yonsei University Industry University Cooperation Foundation) discloses a patterning device which may stably perform patterning with a constant performance regardless of the kind or thickness of a patterning object, and a patterning method using the same. In addition, technologies on methods and devices for forming fine patterns have been continuously researched and developed.

PRIOR TECHNICAL DOCUMENTS

Patent Documents

Korean Patent No. 10-1000715

SUMMARY OF THE INVENTION

The present invention provides a complex patterning device which can easily form a pattern of various sizes and shapes on various substrates, and an operation method thereof.

The present invention also provides a complex patterning device which can easily divide a plurality of target patterns, and an operation method thereof.

The present invention also provides a complex patterning device which easily allows a large area process, and an operation method thereof.

The present invention also provides a complex patterning device which has an improved process stability, and an operation method thereof.

The present invention also provides a complex patterning device which can easily align a target substrate and a punching device, and an operation method thereof.

The objectives of the present invention are not limited to the above-described ones.

In order to solve the technical problems, the present invention provides a complex patterning device.

According to an embodiment, a complex patterning device includes a patterning module, on which a master substrate including a master pattern that contacts and is separated from a target substrate and which forms a plurality of target patterns having a reverse image of the master pattern on the target substrate by applying a pressure onto the target substrate, and a punching module including a punching mold that contacts and is separated from the target substrate, in which the plurality of target patterns are formed, and which divides at least any one of the plurality of target patterns by applying a pressure onto the target substrate.

According to an embodiment, the target substrate and the master pattern may contact each other a plurality of times, and the master pattern may contact different areas on the target substrate for each contact.

According to an embodiment, the target substrate, in which the plurality of target patterns are formed, may include a first division area extending in a first direction, and a second division area extending in a second direction that is different from the first direction, and the plurality of target patterns may form columns and rows by the first division area and the second division area and are aligned 2-dimensionally.

According to an embodiment, the punching mold may include a first cutter part extending in the first direction, and a second cutter part extending in the second direction, and may include a plurality of sink patterns which form columns and rows by the first and second cutter parts and are aligned 2-dimensionally.

According to an embodiment, when the target substrate, in which the plurality of target patterns are formed, and the punching mold contact each other, the first division area and the first cutter part may face each other and the second division area and the second cutter part may face each other.

According to an embodiment, the complex patterning device may further include a stage moved in a first direction, and a second direction that is perpendicular to the first direction, and in which the target substrate is disposed.

According to an embodiment, the target substrate may be moved in the first direction and the second direction as the stage may be moved.

According to an embodiment, the stage may include a first stage configured to move the target substrate to form the plurality of target patterns, and a second stage configured to move the target substrate to divide at least any one of the plurality of target patterns.

According to an embodiment, the hardness of the master pattern may be higher than the hardness of the target substrate.

In order to solve the technical problems, the present invention provides an operation method of a complex patterning device.

According to an embodiment, an operation method of a complex patterning device includes preparing a target substrate on a stage, moving the stage such that a master substrate including a master pattern and the target substrate face each other, forming a plurality of target patterns having a reverse image of the master pattern on the target substrate by bringing the master substrate and the target substrate into contact with each other by applying a pressure, moving the stage such that the target substrate, in which the plurality of target patterns are formed, and a punching mold face each other, and dividing at least any one of the plurality of target patterns included in the target substrate, by moving the punching mold toward the stage and bringing the punching mold and the target substrate into contact with each other and applying a pressure.

According to an embodiment, the forming of the plurality of target patterns may include forming the target pattern having a reverse of the master pattern on an area of the target substrate, by bringing the area of the target substrate and the master substrate into contact with each other and applying a pressure, and separating the target substrate and the master substrate, and the forming of the target pattern and the separating of the substrate may be performed a plurality of times, and the master substrate may contact different areas on the target substrate for each contact.

According to an embodiment, the plurality of target patterns may form columns and rows and are aligned 2-dimensionally.

According to an embodiment, the moving of the stage such that the target substrate, in which the plurality of target patterns are formed, and a punching mold face each other may include disposing first and second target patterns included in the target substrate such that the first and second target patterns face first and second sink patterns included in the punching mold, and disposing a first division area between the first and second target patterns and a first cutter part between the first and second sink patterns are disposed to face each other.

According to an embodiment, the dividing of the at least any one of the plurality of target patterns may include dividing the first and second target patterns by applying a pressure to the first division area through the first cutter part.

The complex patterning device according to the embodiment of the present invention includes a patterning module, on which a master substrate including a master pattern that contacts and is separated from a target substrate and which forms a plurality of target patterns having a reverse image of the master pattern on the target substrate by applying a pressure onto the target substrate; and a punching module including a punching mold that contacts and is separated from the target substrate, in which the plurality of target patterns are formed, and which divides at least any one of the plurality of target patterns by applying a pressure onto the target substrate. Accordingly, a plurality of patterns having various sizes and shapes on various substrates may be manufactured to face each other. Further, the plurality of manufactured patterns may be easily separated in a simple process.

BRIEF DESCRIPTION OF THE DRAWINGS

The above and other objects, features, and advantages of the present invention will be more apparent from the following detailed description taken in conjunction with the accompanying drawings, in which:

FIGS. 34 and 35 are views illustrating a target substrate punched through a punching device according to the eighth modification of the present invention;

DETAILED DESCRIPTION OF THE EXEMPLARY EMBODIMENTS

Figure 1:
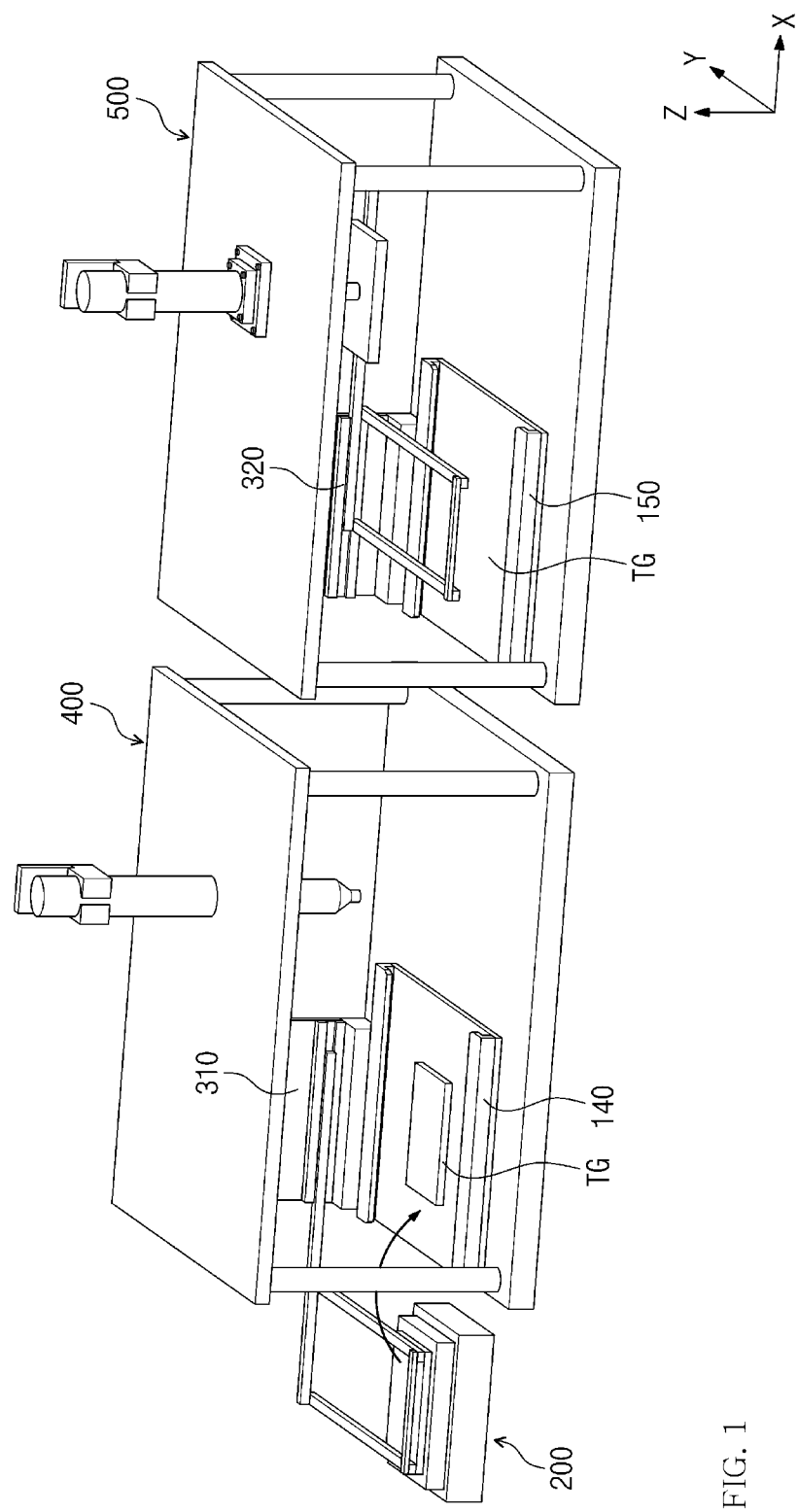
FIG. 1 is a view illustrating a complex patterning device according to an embodiment of the present invention.

Hereinafter, preferred embodiments of the present invention will be described in detail with reference to the accompanying drawings. However, the technical spirit of the present invention is not limited to the embodiments, but may be realized in different forms. The embodiments introduced here are provided to sufficiently deliver the spirit of the present invention to those skilled in the art so that the disclosed contents may become thorough and complete.

In the specification, when it is mentioned that one element is on another element, this means that the first element may be directly on the second element or a third element may be interposed between the first element and the second element. Further, in the drawings, the thicknesses of the membrane and areas are exaggerated for efficient description of the technical contents.

Further, in the various embodiments of the present invention, the terms such as first, second, and third are used to describe various elements, but the elements are not limited to the terms. Accordingly, an element mentioned as a first element in one embodiment may be mentioned as a second element in another embodiment. The embodiments illustrated here include their complementary embodiments. Further, the term "and/or" in the specification is used to include at least one of the elements enumerated in the specification.

Further, the terms "including" and "having" are used to designate that the features, the numbers, the steps, the elements, or combination thereof described in the specification are present, and may be understood that one or more other features, numbers, step, elements, or combinations thereof may be added. Further, in the following description of the present invention, a detailed description of known functions and configurations incorporated herein will be omitted when it may make the subject matter of the present invention unnecessarily unclear.

FIG. 1 is a view illustrating a complex patterning device according to an embodiment of the present invention.

Referring to FIG. 1, the complex patterning device according to the embodiment of the present invention may include a first stage 140, a second stage 150, a target substrate preparing unit 200, a first target substrate moving unit 310, a second target substrate moving unit 320, a patterning module 400, and a punching module 500. According to the embodiment, the complex patterning device may be disposed in a chamber (not illustrated) and be operated in a vacuum environment. Hereinafter, the elements will be described in detail.

A target substrate TG may be prepared in the target substrate preparing unit 200. According to the embodiment, the target substrate TG may be formed of metal, silicon, polymer, leather, hairs of a living thing, peels, or a stretchable material.

The first target substrate moving unit 310 may move the target substrate TG prepared in the target substrate preparing unit 200. In detail, the first target substrate moving unit 310 may move the target substrate TG prepared from the target substrate preparing unit 200 to a first stage 140, which will be described below. Meanwhile, the second target substrate moving unit 320 may move the target substrate TG from the first stage 140, which will be described below, to a second stage 150, which will be described below. According to an embodiment, the stage 130 may be moved by various power sources, such as a servo motor, air, a hydraulic pressure, and an electrical method. The kinds of the power that moves the stage 130 is not limited.

The first stage 140 may receive the target substrate TG from the first target substrate moving unit 310. That is, the target substrate TG may be disposed on the first stage 140. The first stage 140 may be moved in a first direction (X-axis) and in a second direction (Y-axis). When the first stage 140 is moved in the first and second directions, the target substrate TG also may be moved in the first and second directions.

The target substrate TG disposed on the first stage 140 may be moved by the first stage 140, and a plurality of target patterns may be formed by the patterning module 400, which will be described below. The target substrate TG in which the plurality of target patterns are formed may be moved to the second stage 150. The target substrate TG disposed on the second stage 150 may be moved by the second stage 150, and at least one of the plurality of target patterns may be divided by the punching module 500, which will be described below. Here, the patterning module 400 and the punching module 500 will be described in more detail.

Figure 2:
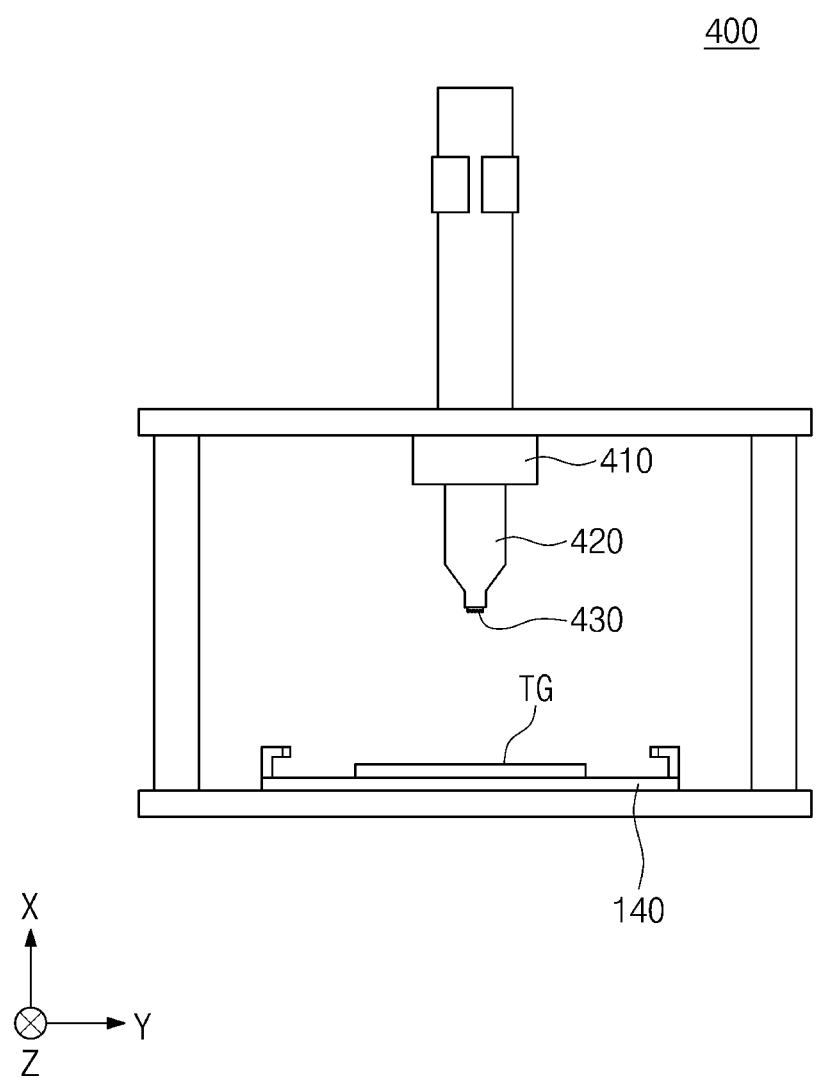
FIG. 2 is a side view of a patterning module included in the complex patterning device according to the embodiment of the present invention.
Figure 3:
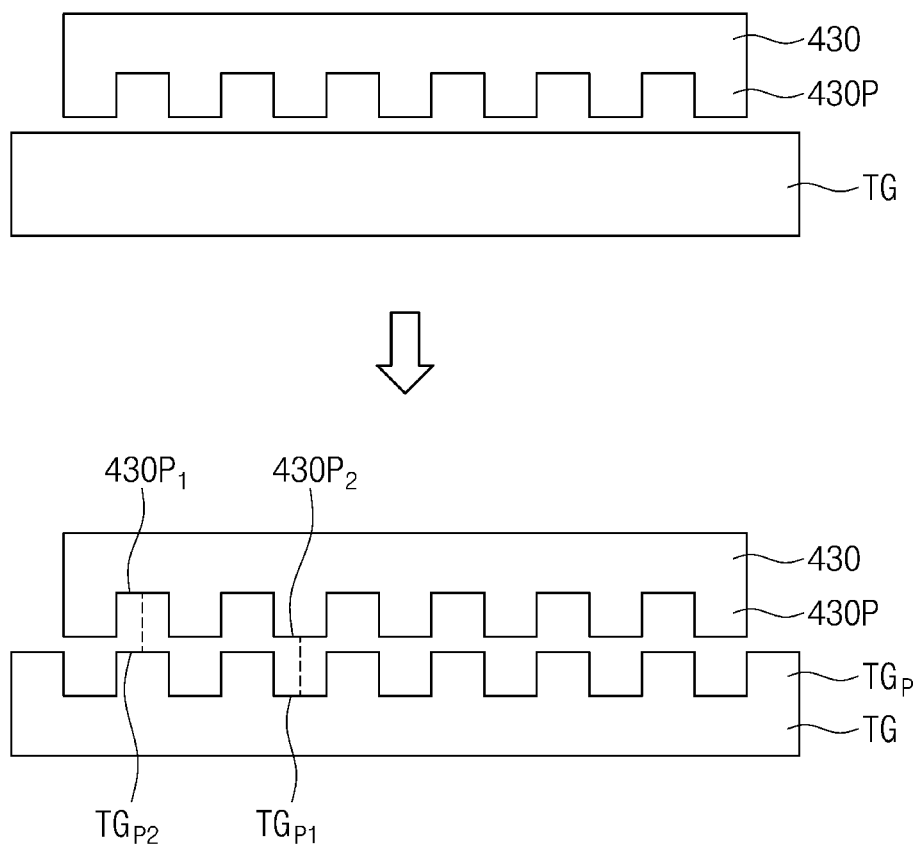
FIG. 3 is a view illustrating that a target pattern is formed on a target substrate by the patterning module according to the embodiment of the present invention.
Figure 4:
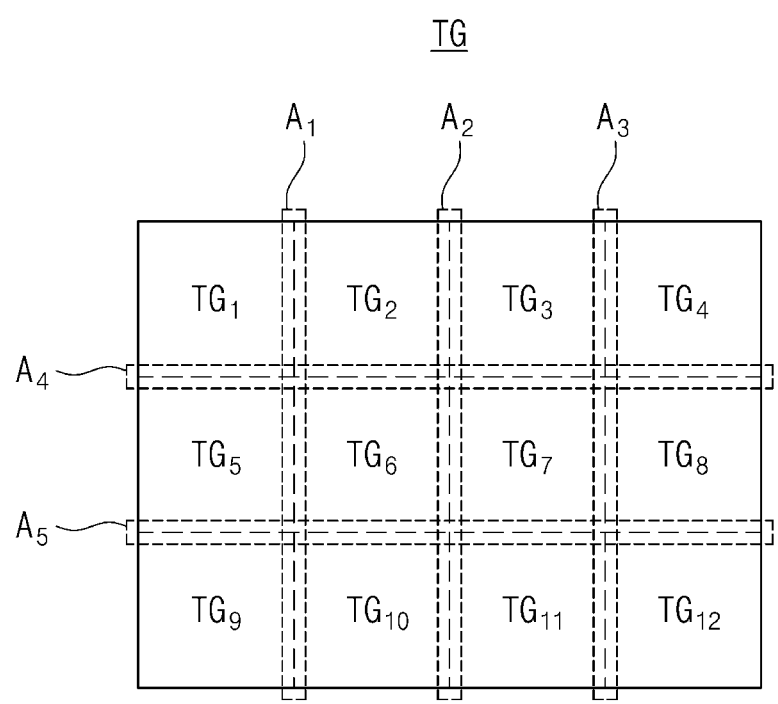
FIG. 4 is a view illustrating a target substrate in which a plurality of target patterns are formed by the patterning module according to the embodiment of the present invention.
Figure 5:
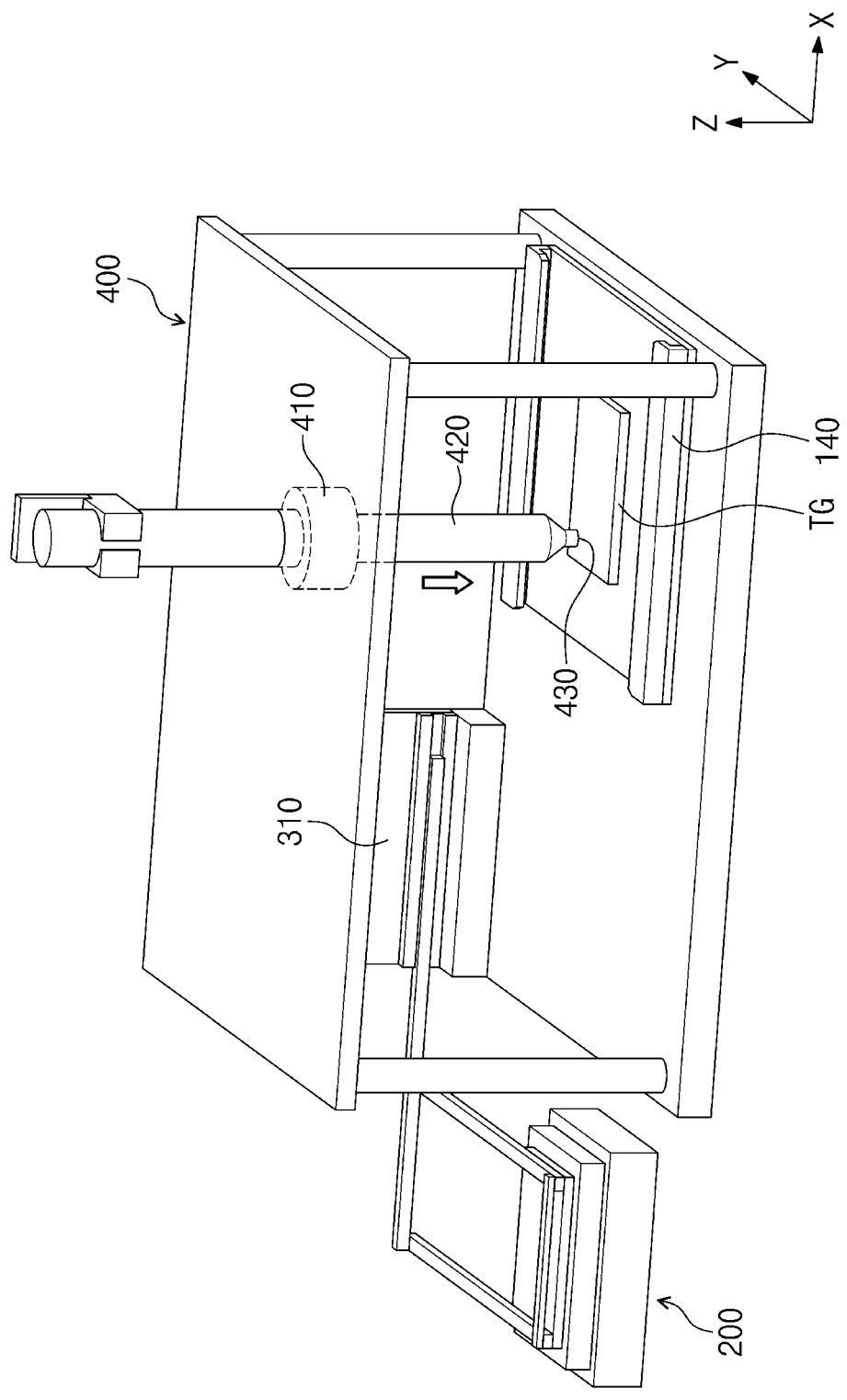
FIGS. 5 to 7 are views illustrating a process of forming target patterns in different areas of a target substrate by the patterning module according to the embodiment of the present invention.
Figure 6:
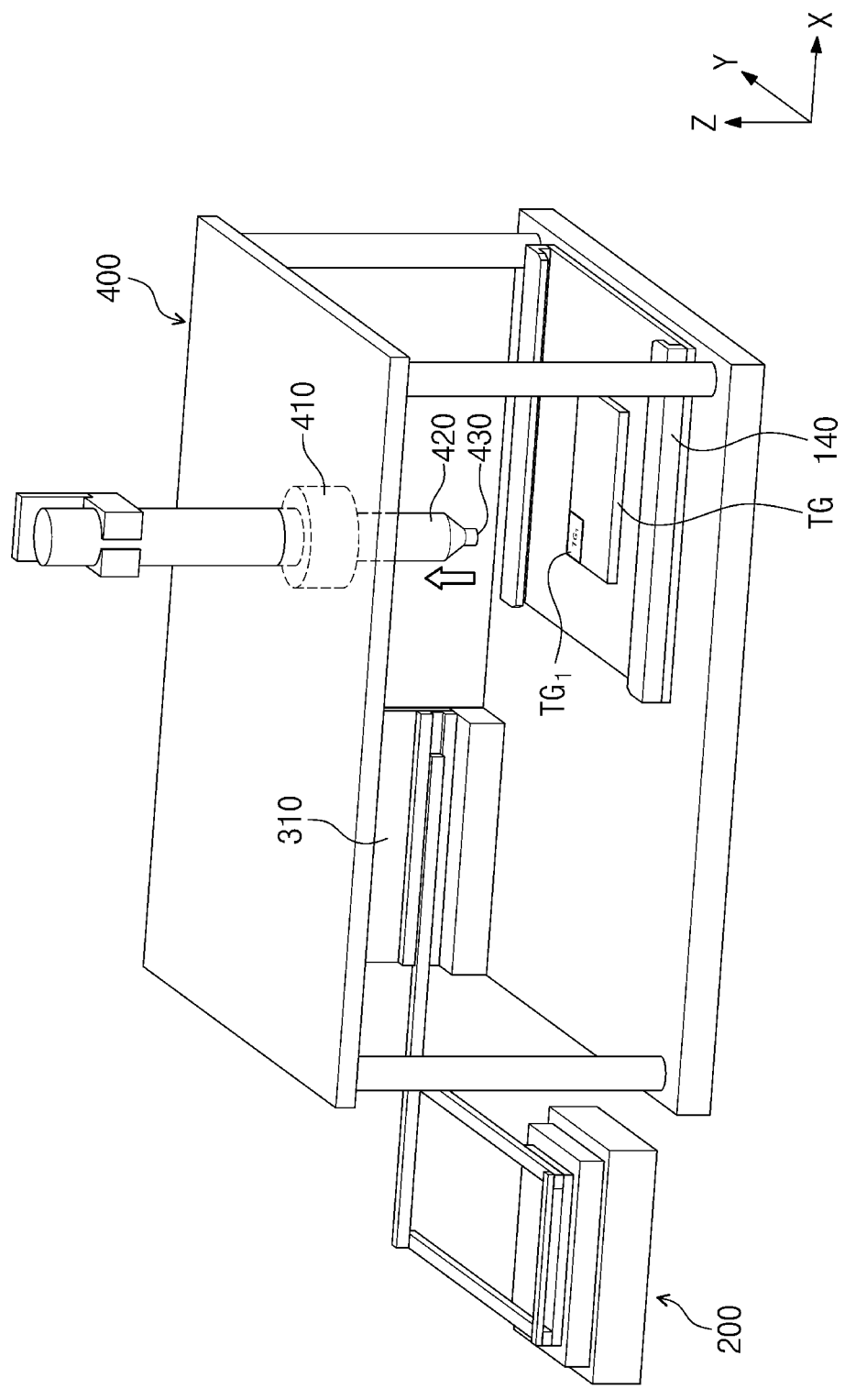
Figure 7:
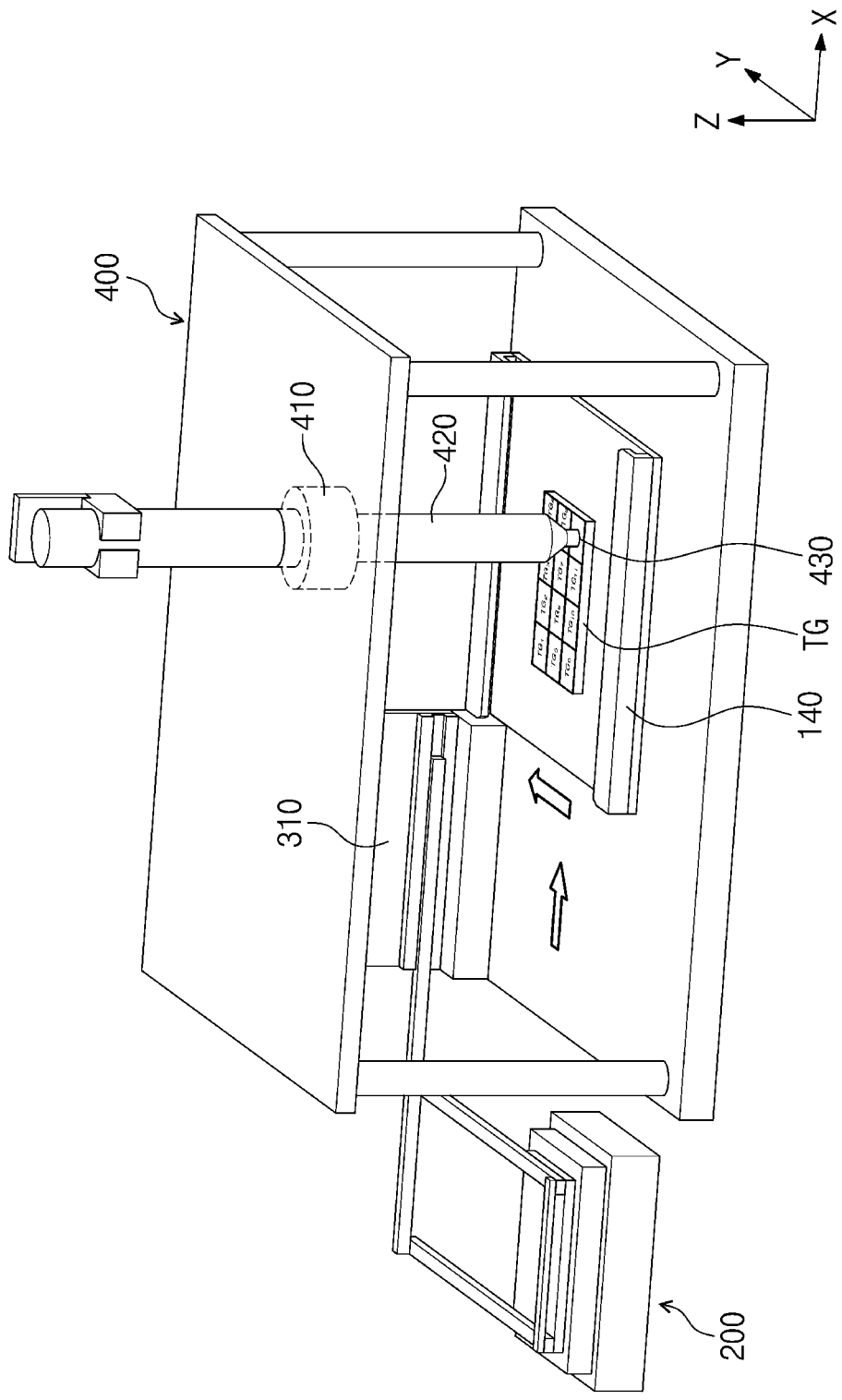

FIG. 2 is a side view of a patterning module included in the complex patterning device according to the embodiment of the present invention. FIG. 3 is a view illustrating that a target pattern is formed on a target substrate by the patterning module according to an embodiment of the present invention. FIG. 4 is a view illustrating a target substrate in which a plurality of target patterns are formed by the patterning module according to the embodiment of the present invention. FIGS. 5 to 7 are views illustrating a process of forming target patterns in different areas of a target substrate by the patterning module according to the embodiment of the present invention.

Referring to FIGS. 2 and 3, the patterning module 400 may include a support member 410 and a ram head 420. The support member 410 may support the ram head 420. The ram head 420 may linearly reciprocate in a third direction (Z-axis). The third direction may be a direction that is perpendicular to the first and second directions.

A master substrate 430 may be mounted on one end of the ram head 420. In detail, the master substrate 430 may be mounted on one end of the ram head 420 through a carbon tape. Unlike this, the master substrate 140 may be mounted on one end of the ram head 144 in various methods such as physical and chemical methods. The mounting method for the master substrate 146 is not limited. According to the embodiment, the hardness of the master substrate 430 may be higher than that of the target substrate TG.

The master substrate 430 may include a master pattern 430P. The master pattern 430P may have a convexo-concave form having concave portions and a convex portions. The form of the master pattern 430P is not limited. According to the embodiment, the master substrate 430 may include a plurality of master patterns 430P. The shapes of the plurality of master patterns 430P may be different. Unlike this, the shapes of the plurality of master patterns 430P may be the same.

According to an embodiment, the master substrate 430 may be formed of metal, a polymer, or self-assembled $SiO_x$ (x>0). According to the embodiment, the master substrate 430 may have various shapes. For example, the master substrate 430 may have a shape, such as a triangular shape, a rectangular shape, a pentagonal shape, or a circular shape. The shape of the master substrate 430 is not limited.

According to the embodiment, the master substrate 430 may be coated. For example, the master substrate 430 may be coated through anodizing. According to another embodiment, the master substrate 430 may be quenched after heat treatment. Accordingly, the hardness of the master substrate 430 may be improved. In this case, the target pattern $TG_p$, which will be described below, may be easily formed. Further, the durability of the master substrate 430 can be improved, and thus the reliability of the process of forming the target pattern $TG_p$, which will be described below, can be improved.

One end of the ram head 420 may face the target substrate TG. Accordingly, the master substrate 420 may face the target substrate TG. Further, the master pattern 430P also may face the target substrate TG. As mentioned above, the ram head 420 included in the pattern module 400 may linearly reciprocate in the third direction (Z-axis direction). Accordingly, the master pattern 430P and the target substrate TG may contact each other and be separated from each other.

According to the embodiment, a voltage may be applied to the ram head 420 and the target substrate TG before the master pattern 430P and the target substrate TG contact each other. When a voltage is applied to the ram head 420, the master substrate 430 disposed at one end of the ram head 420 may be charged. Further, the target substrate TG also may be charged. When the master substrate 430 and the target substrate TG are charged, surrounding dust may be easily stuck to the master substrate 430 and the target substrate TG. The dust stuck to the master substrate 430 and the target substrate TG can be removed. Accordingly, dust is involved in a process of forming a target pattern $TG_p$, which will be described below, and thus a situation in which the target pattern $TG_p$ is not easily formed can be prevented.

When the master pattern 430P included in the master substrate 430 contacts the target substrate TG, the patterning module 400 may apply a pressure onto the target substrate TG. Accordingly, the target pattern $TG_p$ may be formed on the target substrate TG. According to the embodiment, the pressure applied onto the target substrate TG may be controlled according to the kind of the material of the target substrate TG.

The target pattern $TG_p$ may have a reverse image of the master pattern 430P. In detail, the target pattern $TG_p$ includes a concave portion $TG_{p1}$ and a convex portion $TG_{p2}$, and the concave portion $TG_{p1}$ of the target pattern $TG_p$ may correspond to the convex portion $430_{P2}$ of the master pattern 430. Further, the convex portion $TG_{p2}$ of the target pattern $TG_p$ may correspond to the concave portion $430_{p1}$ of the master pattern 430. According to the embodiment, the target substrate TG and the master pattern 430P may contact each other a plurality of times. In this case, for each contact, the master pattern 430P may contact different areas on the target substrate TG. Hereinafter, referring to FIGS. 4 to 7, a process of forming the target pattern $TG_p$ on different areas of the target substrate TG will be described.

Referring to FIGS. 4 to 7, the target substrate TG may be classified into a plurality of areas. For example, as illustrated in FIG. 4, the target substrate TG may be classified into first to twelfth areas $TG_1$ to $TG_{12}$. The shapes and sizes of the classified areas of the target substrate TG are not limited.

Target patterns (not indicated) may be formed in the first to twelfth areas $TG_1$ to $TG_{12}$, respectively. To achieve this, the master pattern (not indicated) may contact the first to twelfth areas $TG_1$ to $TG_{12}$. According to the embodiment, in order that the master pattern (not indicated) contacts different areas on the target substrate TG, the movement of the first stage 140 may be controlled. Accordingly, the movement of the target substrate TG in the first direction and in the second direction may be controlled. For example, as illustrated in FIG. 6, after the target pattern (not indicated) is formed on the first area $TG_1$, the target substrate TG may be moved in the first direction and may contact the master pattern (not indicated). The above-mentioned method is repeated to form the target pattern (not indicated) on the second to fourth areas $TG_2$, $TG_3$, and $TG_4$. After the target pattern (not indicated) is formed on the fourth area $TG_4$, the target substrate TG is moved in the first direction and in the second direction, and thus the target pattern (not indicated) may be formed on the fifth area TG5. The above-mentioned method is repeated, and as illustrated in FIG. 7, the target pattern (not indicated) may be formed in all of the first to twelfth areas $TG_1$ to $TG_{12}$.

According to the embodiment, after the target pattern (not indicated) is formed and before the target substrate TG is moved, the ram head 420 may be rotated. Accordingly, the master pattern (not indicated) also may be rotated. Accordingly, target patterns of different shapes may be formed in the first to twelfth areas $TG_1$ to $TG_{12}$. For example, a target pattern having a reverse shape of the master pattern may be formed in the first area $TG_1$. Unlike this, a reverse image of the master pattern, which has been rotated by 90°, may be formed in the second area $TG_2$.

According to an embodiment, as illustrated in FIG. 4, the target substrate TG may be classified into first to fifth division areas $A_1$ to $A_5$. That is, the target substrate TG may include first to twelfth target patterns (not illustrated) which form columns and rows by the first to fifth division areas $A_1$ to $A_5$ and are aligned 2-dimensionally.

Figure 8:
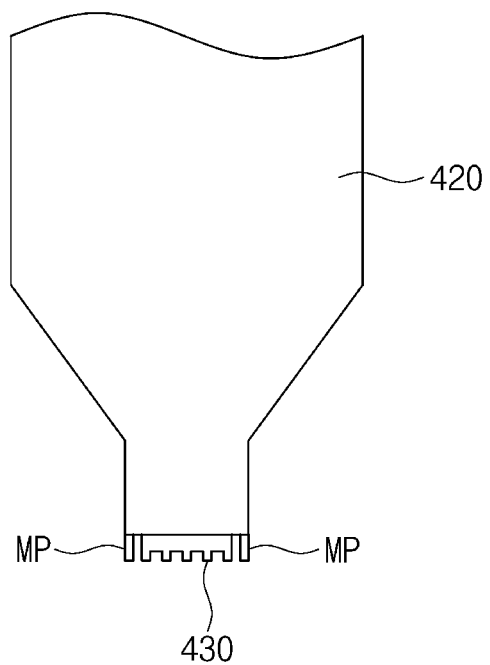
FIG. 8 is a view illustrating a marking pattern included in a ram head according to the embodiment of the present invention.
Figure 9:
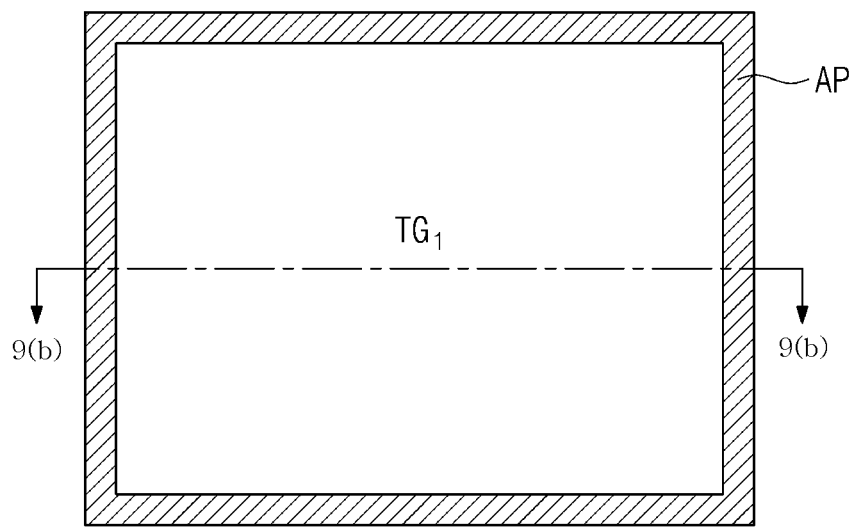
FIGS. 9 and 10 are views illustrating an alignment pattern formed on a target substrate through the marking pattern included in the ram head according to the embodiment of the present invention.
Figure 9:
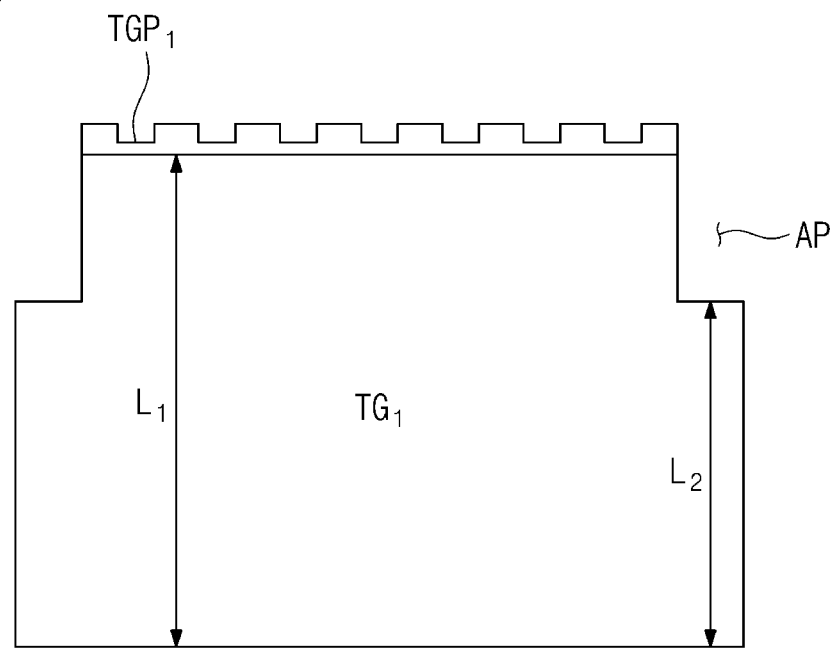
Figure 11:
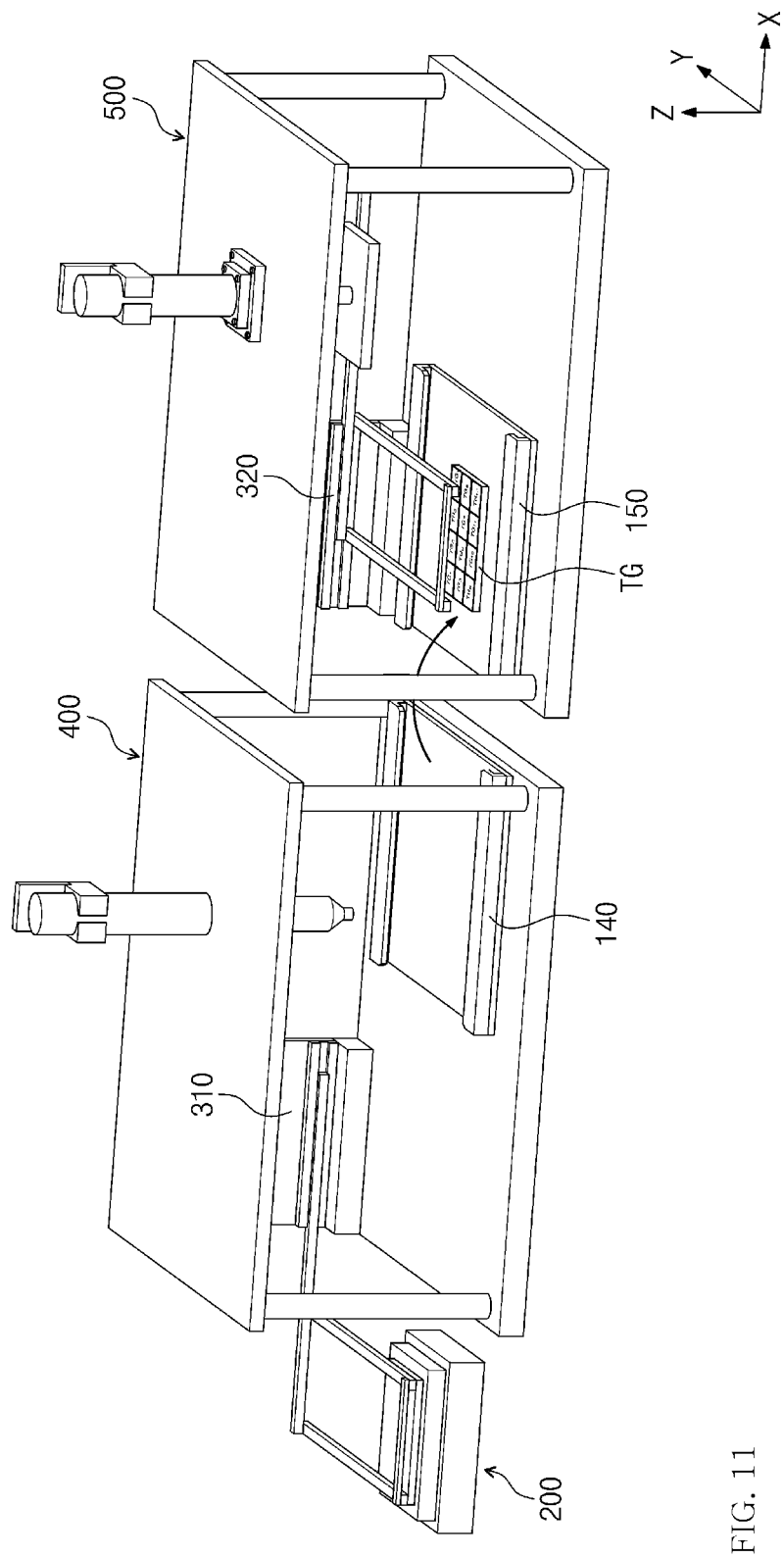
FIG. 11 is a view illustrating that a target substrate disposed in a first stage is moved to a second stage.

FIG. 8 is a view illustrating a marking pattern included in a ram head according to the embodiment of the present invention. FIGS. 9 and 11 are views illustrating an alignment pattern formed on a target substrate through the marking pattern included in the ram head according to the embodiment of the present invention.

Referring to FIGS. 8 to 11, the ram head 420 according to the embodiment may further include a marking pattern MP. The marking pattern MP may be disposed at one end of the ram head 420, and may surround the master pattern 430. For example, as illustrated in FIG. 8, the master pattern 430 may be disposed at a central portion of one end of the ram head 420, and the marking pattern MP may be disposed at an outskirt portion of the one end of the ram head 420.

When the master pattern (not indicated) and the target substrate TG contact each other, the marking pattern MP also may contact the target substrate TG. When the marking pattern (not indicated) contacts the target substrate TG, an alignment pattern (AP) may be formed in the target substrate TG. The alignment pattern (AP) may classify the first to twelfth areas $TG_1$ to $TG_{12}$ included in the target substrate TG. As a result, by the alignment pattern (AP), the target patterns formed on the first to twelfth areas $TG_1$ to $TG_{12}$ may be easily classified.

Figure 10:
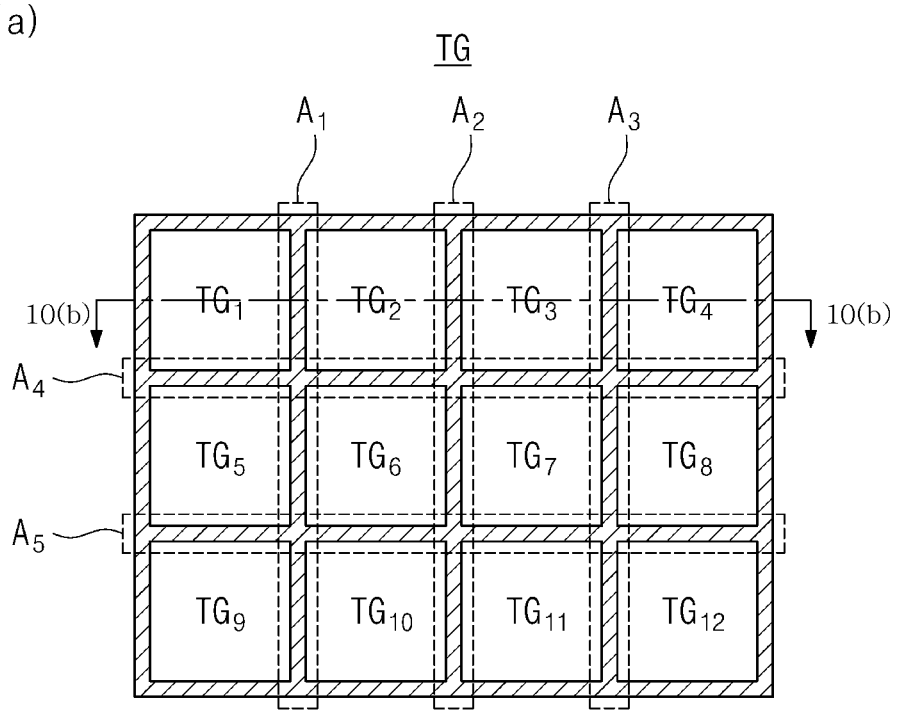
Figure 10:
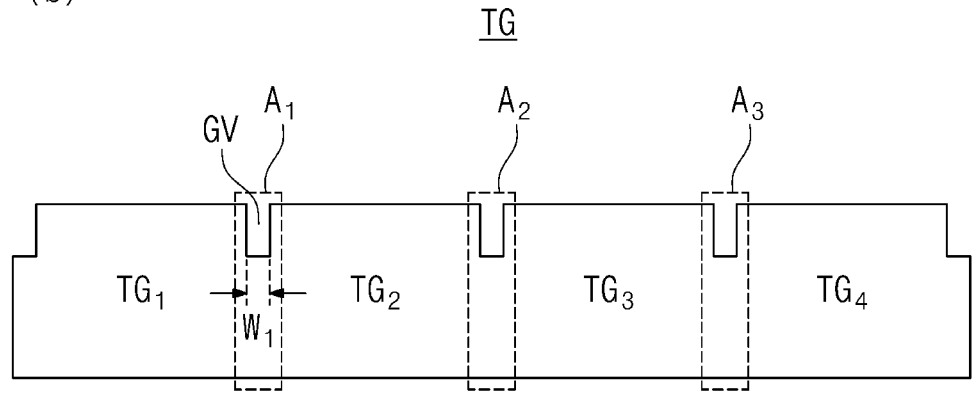

According to the embodiment, the level $L_2$ of the alignment pattern (AP) may be lower than the level $L_1$ of the target pattern. That is, as illustrated in FIG. 9, the height from the lower surface of the target substrate TG to the alignment pattern AP may be lower than the height from the lower surface of the target substrate TG to the first target pattern $TG_{P1}$. Further, the alignment pattern AP may surround the periphery of the target pattern. Accordingly, as illustrated in FIG. 10, grooves GV by the alignment pattern AP may be formed between adjacent target areas of the target substrate TG. As a result, the grooves GV by the alignment pattern (AP) may be formed in the first to fifth division areas $A_1$ to $A_5$.

Figure 12:
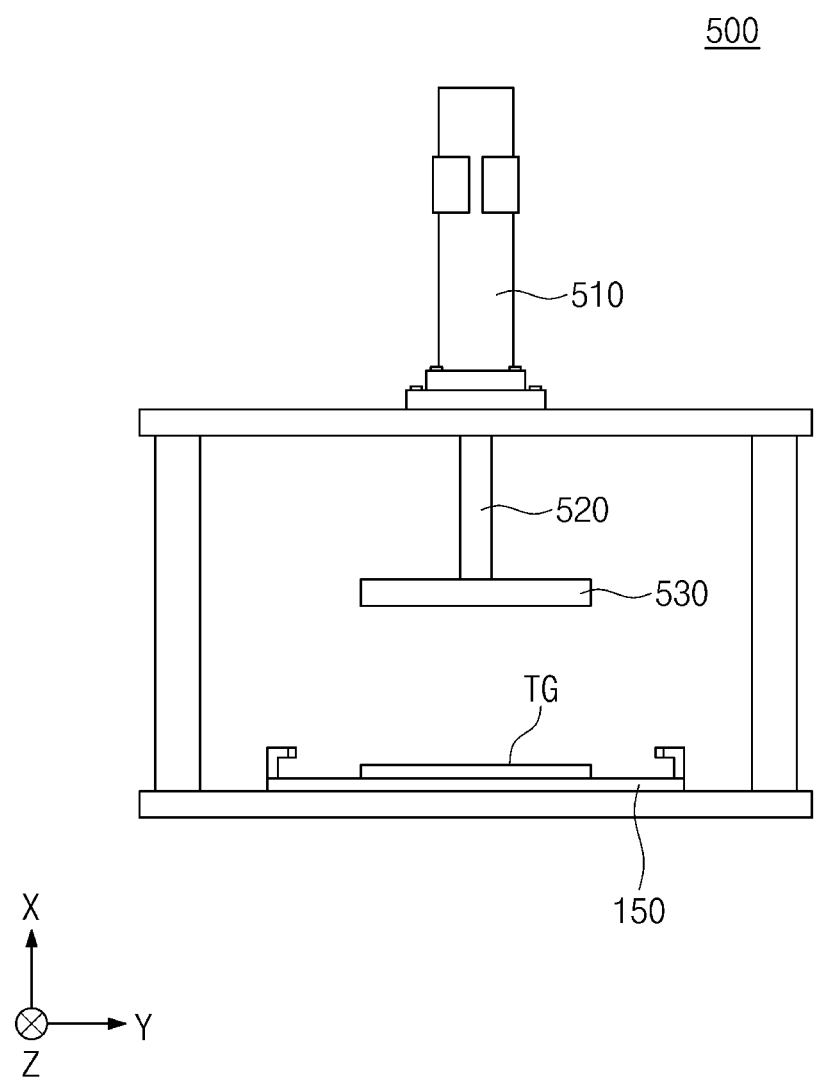
FIG. 12 is a view illustrating the punching module included in the complex patterning device according to the embodiment of the present invention.
Figure 13:
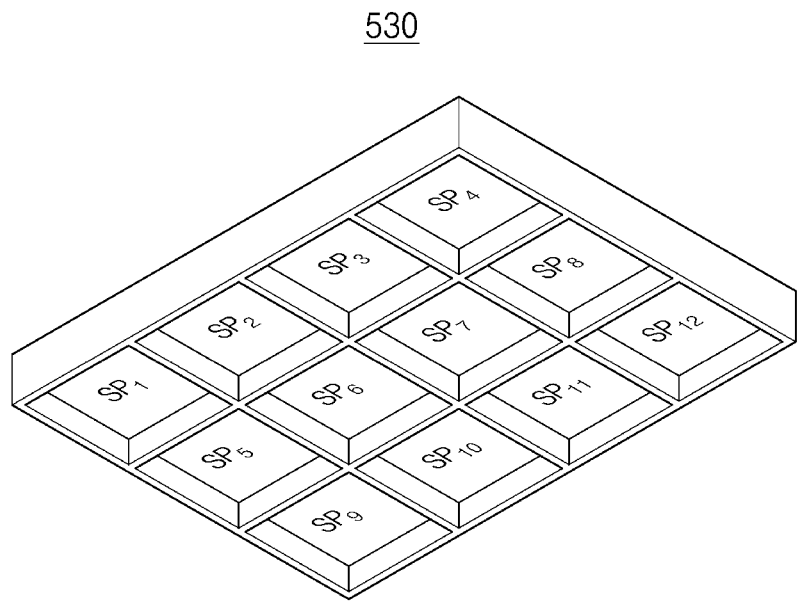
FIGS. 13 and 14 are views illustrating a punching mold included in the punching module according to the embodiment of the present invention.
Figure 14:
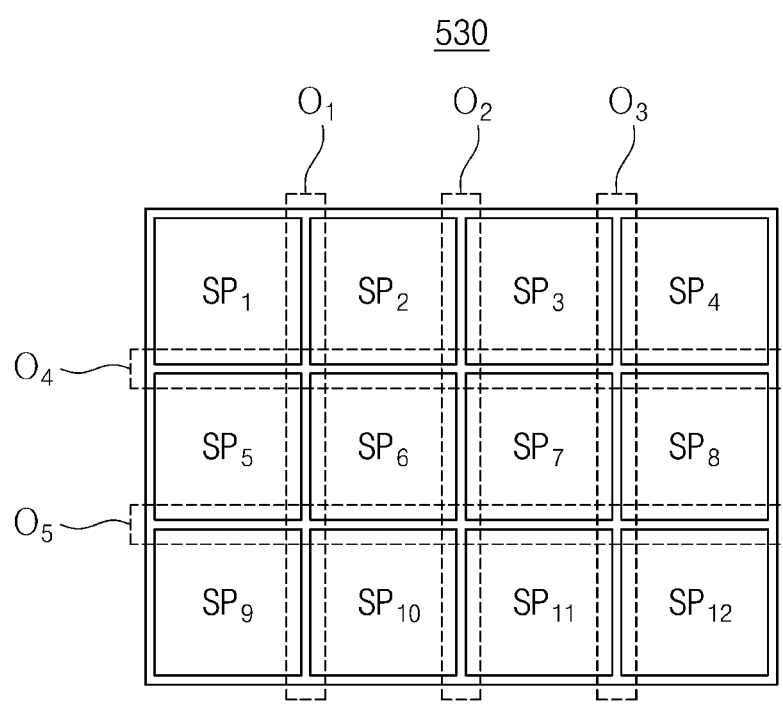
Figure 15:
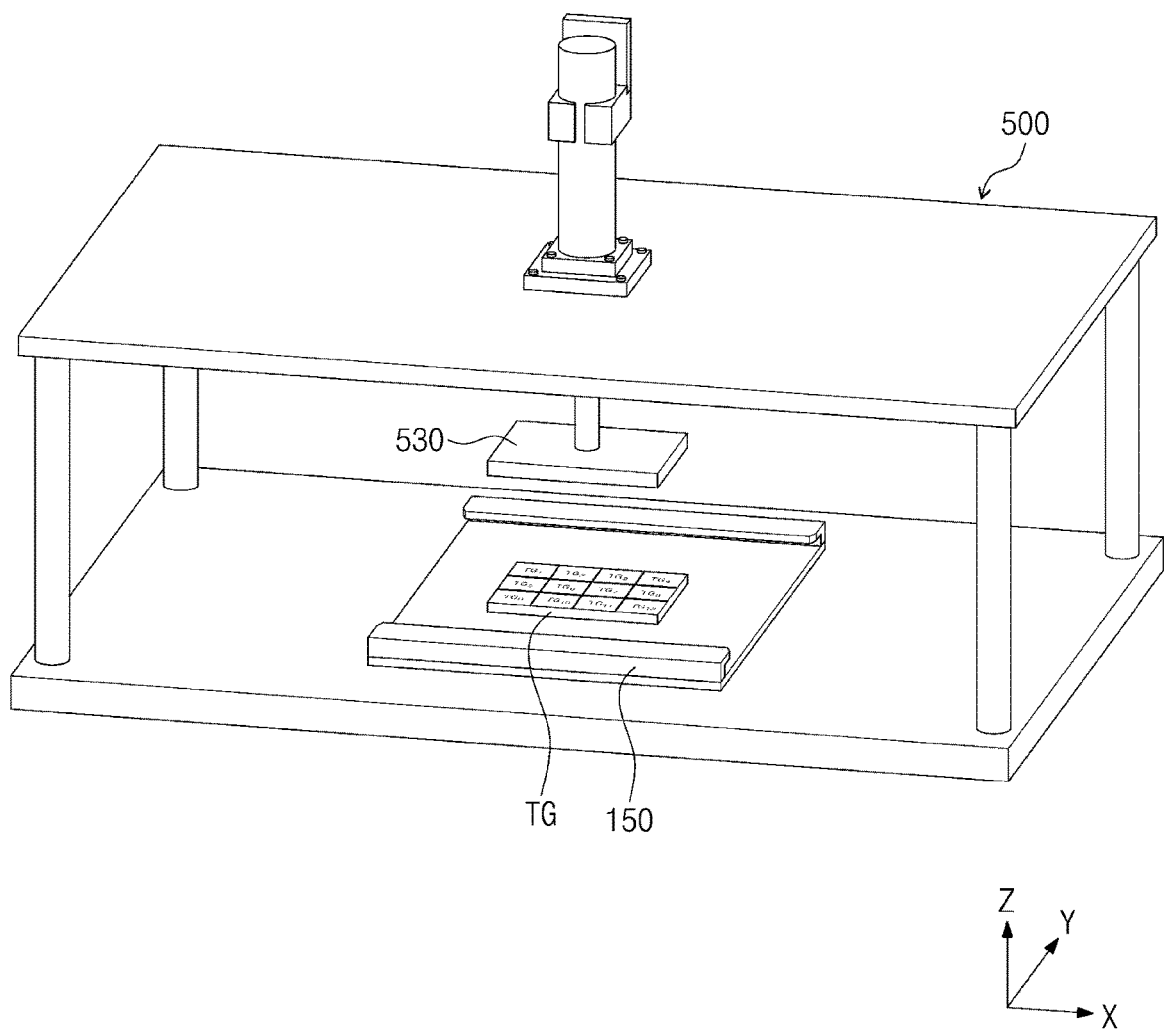
FIGS. 15 to 17 are views illustrating a punching process through the punching module according to the embodiment of the present invention.
Figure 16:
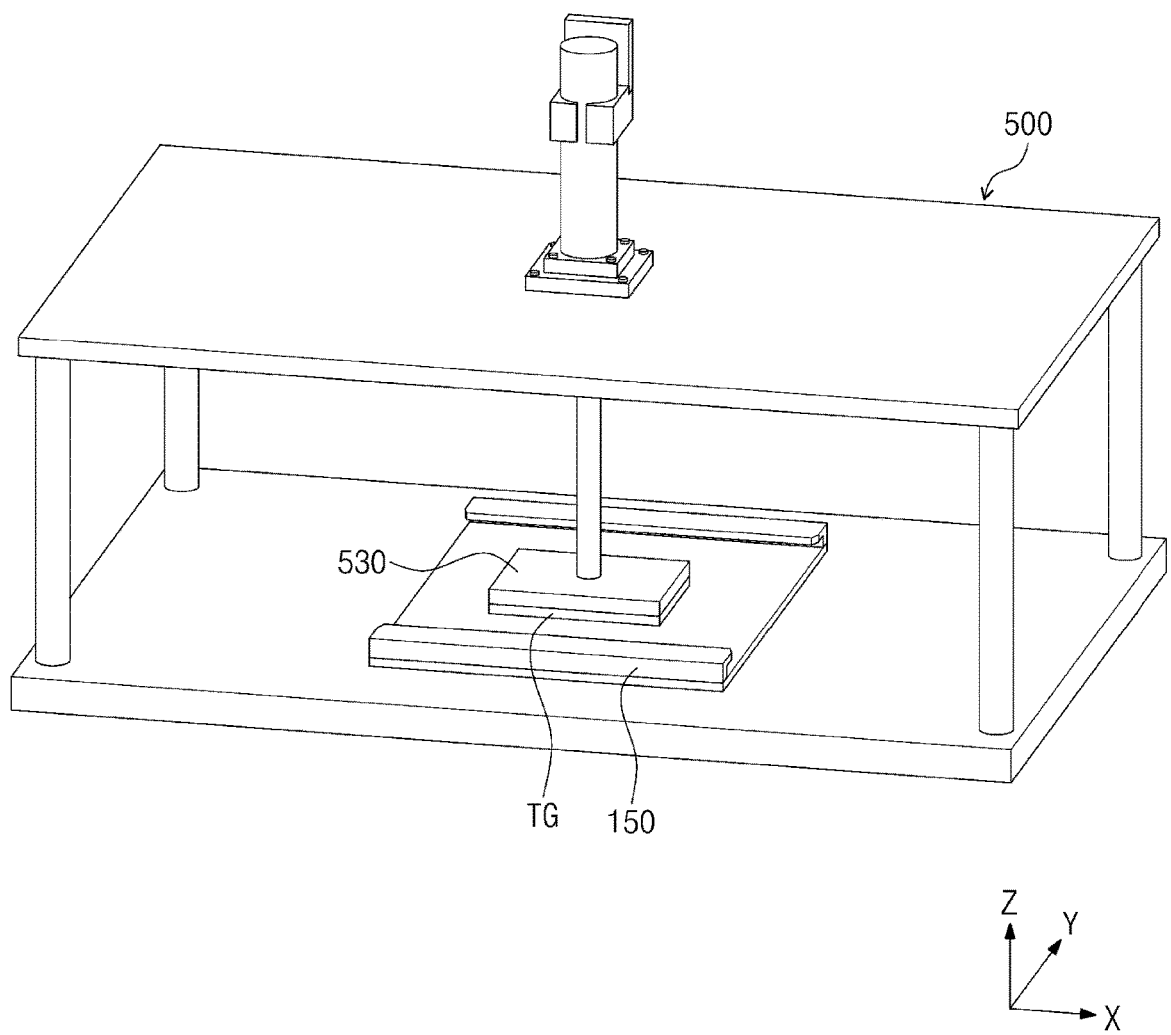
Figure 17:
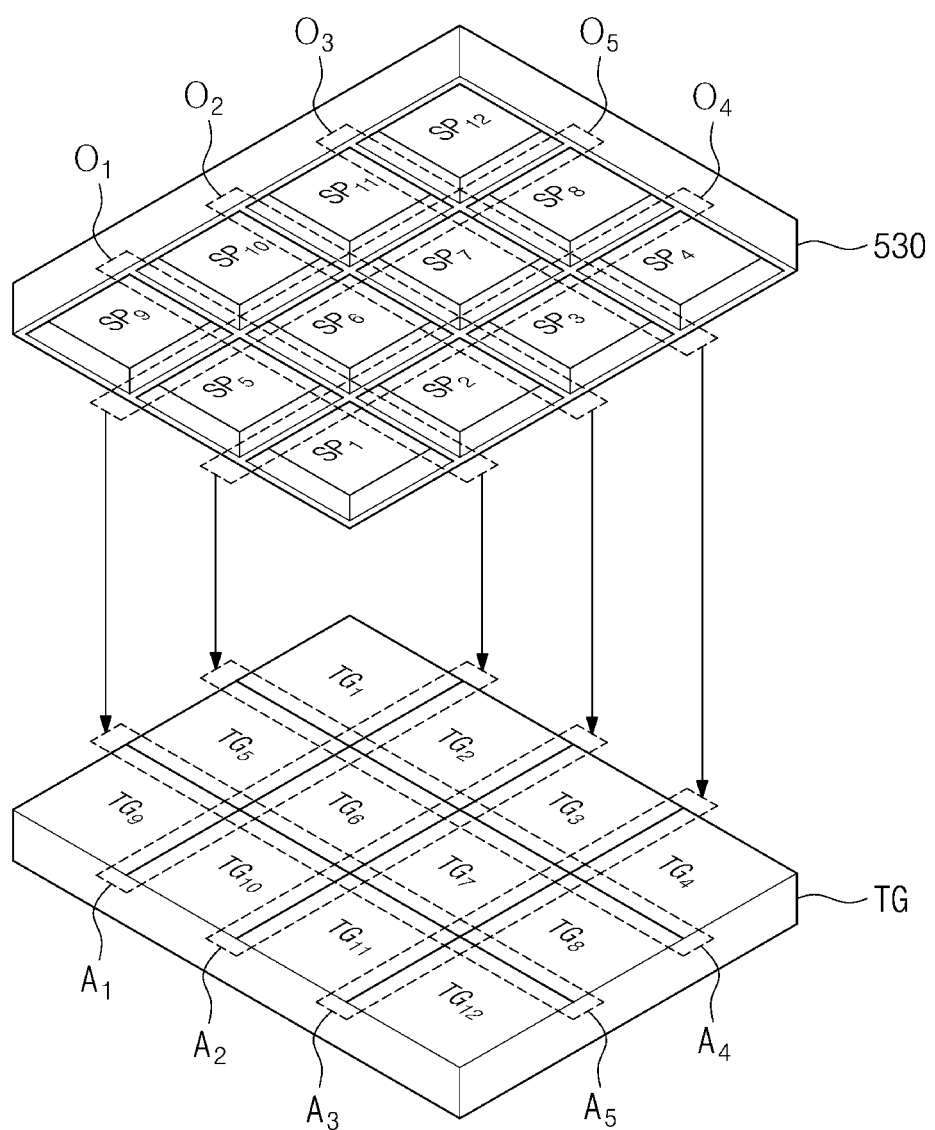
Figure 18:
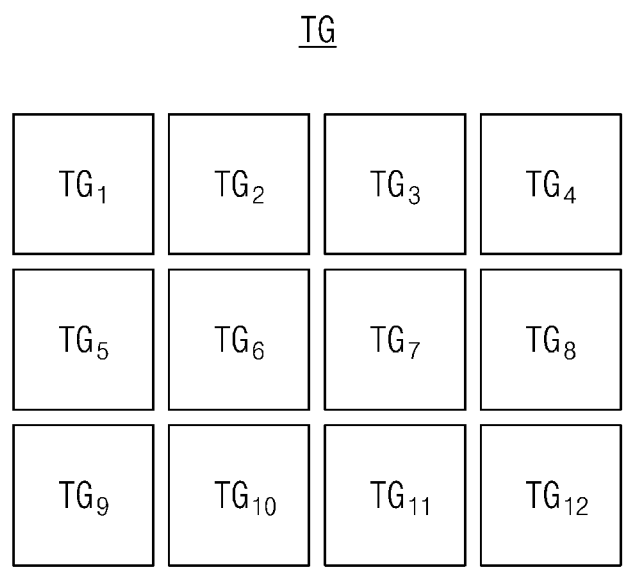
FIGS. 18 and 19 are views illustrating a target substrate on which a punching process is performed.
Figure 19:
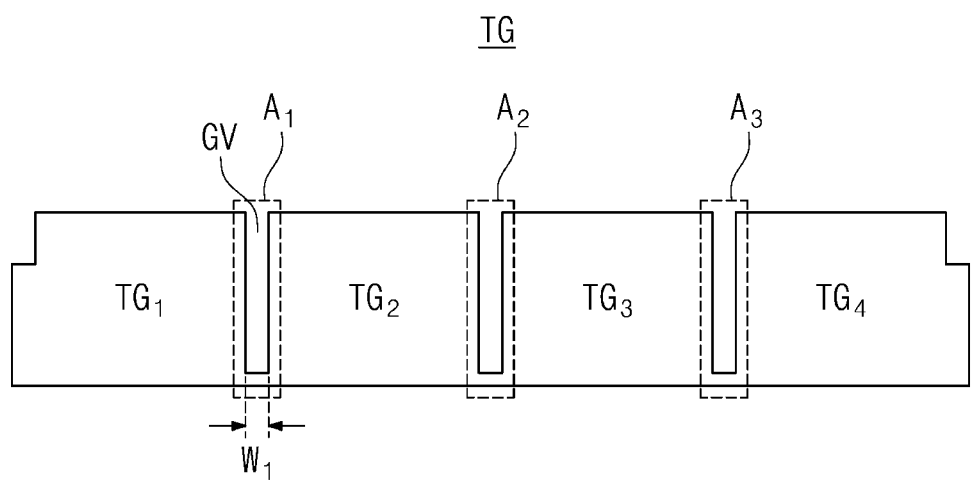

FIG. 11 is a view illustrating that a target substrate disposed in a first stage is moved to a second stage. FIG. 12 is a view illustrating the punching module included in the complex patterning device according to the embodiment of the present invention. FIGS. 13 and 14 are views illustrating a punching mold included in the punching module according to the embodiment of the present invention. FIGS. 15 and 17 are views illustrating a punching process through the punching module according to the embodiment of the present invention. FIGS. 18 and 19 are views illustrating a target substrate on which a punching process is performed.

Referring to FIG. 11, the target substrate TG in which the plurality of target patterns are formed through the patterning module 400 may be moved from the first stage 140 to the second stage 150 by the second target substrate moving unit 320. The second stage 140 may be moved in the first and second directions. Accordingly, in the target substrate TG disposed on the second stage 150, at least one of the plurality of target patterns may be divided by the punching module 500. Hereinafter, the punching module 500 and a process of dividing a pattern by the punching module 500 will be described in more detail.

Referring to FIG. 12, the punching module 500 may include a support member 510, a piston 520, and a punching mold 530. The support member 510 and the piston 520 may extend in the third direction. The piston 520 may be coupled to one end of the support member 510, and may be supported by the support member 510. Further, the piston 520 may linearly reciprocate in the third direction. The punching mold 530 may be coupled to one end of the piston 520. Accordingly, when the piston 520 linearly reciprocate in the third direction, the punching mold 530 also may linearly reciprocate in the third direction. Hereinafter, the punching mold 530 will be described in more detail with reference to FIGS. 13 and 14.

The punching mold 530 may include a plurality of sink patterns. For example, as illustrated in FIG. 13, the punching mold 530 may include first to twelfth sink patterns $SP_1$ to $SP_{12}$. According to an embodiment, adjacent sink patterns of the plurality of sink patterns may be disposed to be spaced part from each other. Accordingly, as illustrated in FIG. 14, the punching mold 530 may include first to fifth cutter parts $O_1$ to $O_5$. That is, the first to fifth cutter parts $O_1$ to $O_5$ are areas between the spaced sink patterns, and may be protruding areas as compared with the first to twelfth sink patterns $SP_1$ to $SP_{12}$. As a result, the punching mold 530 may include first to twelfth sink patterns $SP_1$ to $SP_{12}$ which form columns and rows by the first to fifth cutter parts $O_1$ to $O_5$ and are aligned 2-dimensionally.

According to the embodiment, the first to fifth cutter parts $O_1$ to $O_5$ and the first to twelfth sink patterns $SP_1$ to $SP_{12}$ may be disposed on one surface of the punching mold 530. One surface of the punching mold 530 may face the second stage 140. Accordingly, when the target pattern TG is moved by the second stage 140, one surface of the punching mold 530 and the target substrate TG may face each other.

Referring to FIGS. 15 to 19, the target substrate TG may be moved by the second stage 140, and may face the punching mold 530. In this case, when the first to twelfth sink patterns $SP_1$ to $SP_{12}$ included in the punching mold 530 may be disposed to face the first to twelfth target areas $TG_1$ to $TG_{12}$ included in the target substrate TG.

When the target substrate TG and the punching mold 530 are disposed to face each other, the punching mold 530 may be moved in the third direction. Accordingly, the punching mold 530 and the target substrate TG may contact each other. After the punching mold 530 and the target substrate TG contact each other, the punching mold 530 may apply a pressure onto the target substrate TG. The pressure applied onto the target substrate TG may be controlled according to the kind of the material of the target substrate TG.

According to the embodiment, when the punching mold 530 and the target substrate TG contact each other, as illustrated in FIG. 17, the first to fifth cutter parts $O_1$ to $O_5$ may contact first to fifth division areas $A_1$ to $A_5$, respectively. Accordingly, the first to fifth cutter parts $O_1$ to $O_5$ may apply pressures to the first to fifth division areas $A_1$ to $A_5$, respectively. In this case, the magnitudes of the pressures applied onto the first to fifth division areas $A_1$ to $A_5$ may be the same.

When a pressure is applied onto the target substrate TG through the punching mold 530, one of the plurality of target areas included in the target substrate TG may be divided. For example, as mentioned above, when pressures are applied to the first to fifth division areas $A_1$ to $A_5$ through the first to fifth cutter parts $O_1$ to $O_5$, as illustrated in FIG. 18, the target substrate TG may be divided into the first to twelfth target areas $TG_1$ to $TG_{12}$. As a result, first to twelfth target patterns (not illustrated) disposed on the first to twelfth target areas $TG_1$ to $TG_{12}$ may be individually divided.

According to an embodiment, the magnitude of the pressure provided onto the target substrate TG through the punching mold 446 may be controlled. In detail, a pressure, the magnitude of which is smaller than a reference pressure that is necessary for dividing the plurality of target areas, may be provided onto the target substrate TG. In this case, the plurality of target areas may not be divided. Meanwhile, grooves GV may be formed between the plurality of target areas. For example, as illustrated in FIG. 11, a groove GV may be formed between the first target area $TG_1$ and the second target area $TG_2$.

The complex patterning device according to the embodiment of the present invention may include the patterning module 400, on which the master substrate 430 including the master pattern $TG_p$, which contacts or is separated from the target substrate TG, is mounted and which forms the plurality of target patterns $TG_p$ having a reverse image of the master pattern $TG_p$ on the target substrate TG by applying a pressure onto the target substrate TG, and the punching module 500 including the punching mold 530, which contacts or is separated from the target substrate TG in which the plurality of target patterns $TG_p$ are formed, and which divides at least one of the plurality of target patterns $TG_p$ by applying a pressure onto the target substrate TG. Accordingly, a plurality of patterns having various sizes and shapes on various substrates may be manufactured to face each other. Further, the plurality of manufactured patterns may be easily separated in a simple process.

Further, in the description of the complex patterning device according to the embodiment of the present invention, it has been described that, after a pattern is formed first through the patterning module 400, the formed pattern is divided through the punching module 500. However, unlike this, after the target substrate TG is separated first through the punching module 500, a pattern may be formed on the target substrate TG separated through the patterning module 400. That is, the sequence of the pattern forming process and the punching process is not limited.

Until now, the complex patterning device according to the embodiment of the present invention has been described. Hereinafter, various modifications of the patterning module 400 and the punching module 500 included in the complex patterning device according to the embodiment will be described.

Complex Patterning Device According to First Modification

Figure 20:
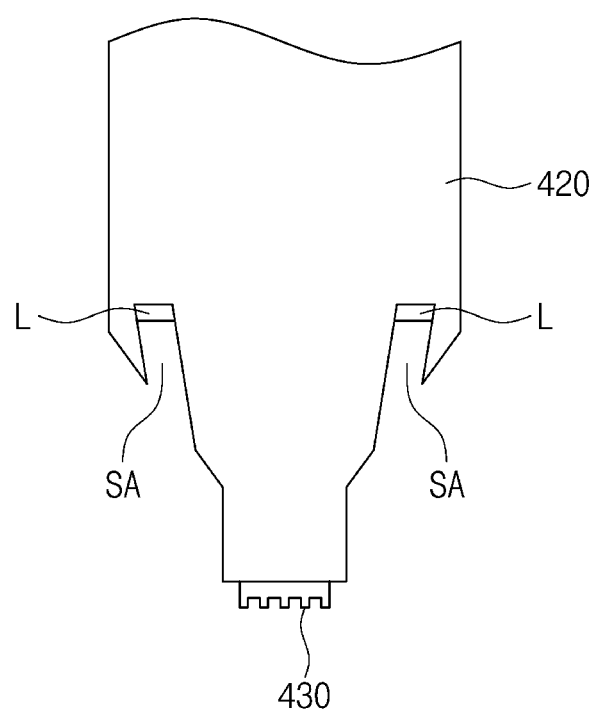
FIG. 20 is a view of a patterning module included in a complex patterning device according to a first modification of the present invention.

FIG. 20 is a view of a patterning module included in a complex patterning device according to a first modification of the present invention.

Referring to FIG. 20, the complex patterning device according to the first modification of the present invention may be the same as the complex patterning device according to the embodiment, except for the patterning module 400. Accordingly, a detailed description of the same configuration will be omitted.

The patterning module 400 included in the complex patterning device according to the first modification may include a support member (not indicated), a ram head 420, and a light source L. Further, as illustrated in FIG. 20, the ram head 420 may include a sink area SA. In detail, the sink area SA may be disposed in an inclined zone, the diameter of which becomes narrower in the ram head 420.

According to the embodiment, the light source L may be disposed in the interior of the sink area SA. For example, the light source L may be an ultraviolet (UV) ray irradiation device. The ultraviolet (UV) ray irradiated from the light source L may be provided to the target substrate TG. In this case, the sink area SA may act as a guide which limits the area of the target substrate TG, to which an ultraviolet ray is irradiated. That is, the ultraviolet ray irradiated from the light source L may be provided to a specific area on the target substrate TG as it is guided by the sink area SA. In detail, the ultraviolet ray guided by the sink area SA may be provided to an area of the target substrate TG in contact with the master substrate 430.

In detail, as described with reference to FIGS. 5 to 7, when the master substrate 430 sequentially contacts the first to twelfth areas $TG_1$ to $TG_{12}$ on the target substrate TG, the ultraviolet ray also may be sequentially provided to the first to twelfth areas $TG_1$ to $TG_{12}$. The ultraviolet ray may cure the target substrate TG. As a result, the target patterns $TG_p$ formed on the first to twelfth areas $TG_1$ to $TG_{12}$ may be sequentially cured.

When the target patterns $TG_p$ formed on the first to twelfth areas $TG_1$ to $TG_{12}$ are sequentially cured, the reliability of the formation of the target patterns $TG_p$ can be improved. In detail, when the target pattern $TG_p$ is formed on the second area TG2 in a state in which the target pattern $TG_p$ formed on the first area $TG_1$ is cured, the pressure applied to the second area $TG_2$ that is adjacent to the first area $TG_1$ can be easily endured as the target pattern $TG_p$ formed on the first area $TG_1$ has a high hardness.

That is, after the target pattern $TG_p$ is formed on a specific area on the target substrate TG, the patterning module 400 according to the first modification may cure the formed target pattern $TG_p$ through an ultraviolet ray. Accordingly, while the plurality of target patterns $TG_p$ are formed on the target substrate TG, a damage to the target patterns $TG_p$ formed in advance can be prevented and the reliability of the formation of the target patterns can be enhanced.

Complex Patterning Device According to Second Modification

Figure 21:
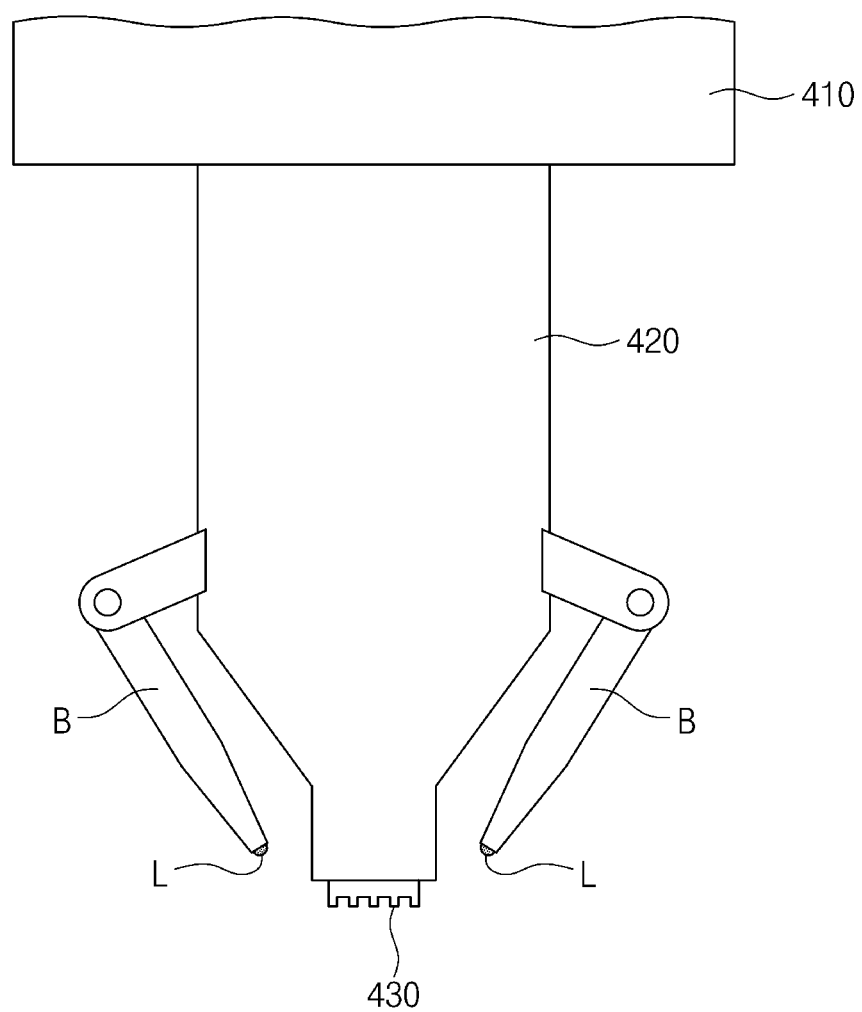
FIG. 21 is a side view of a patterning module included in a complex patterning device according to a second modification of the present invention.
Figure 22:
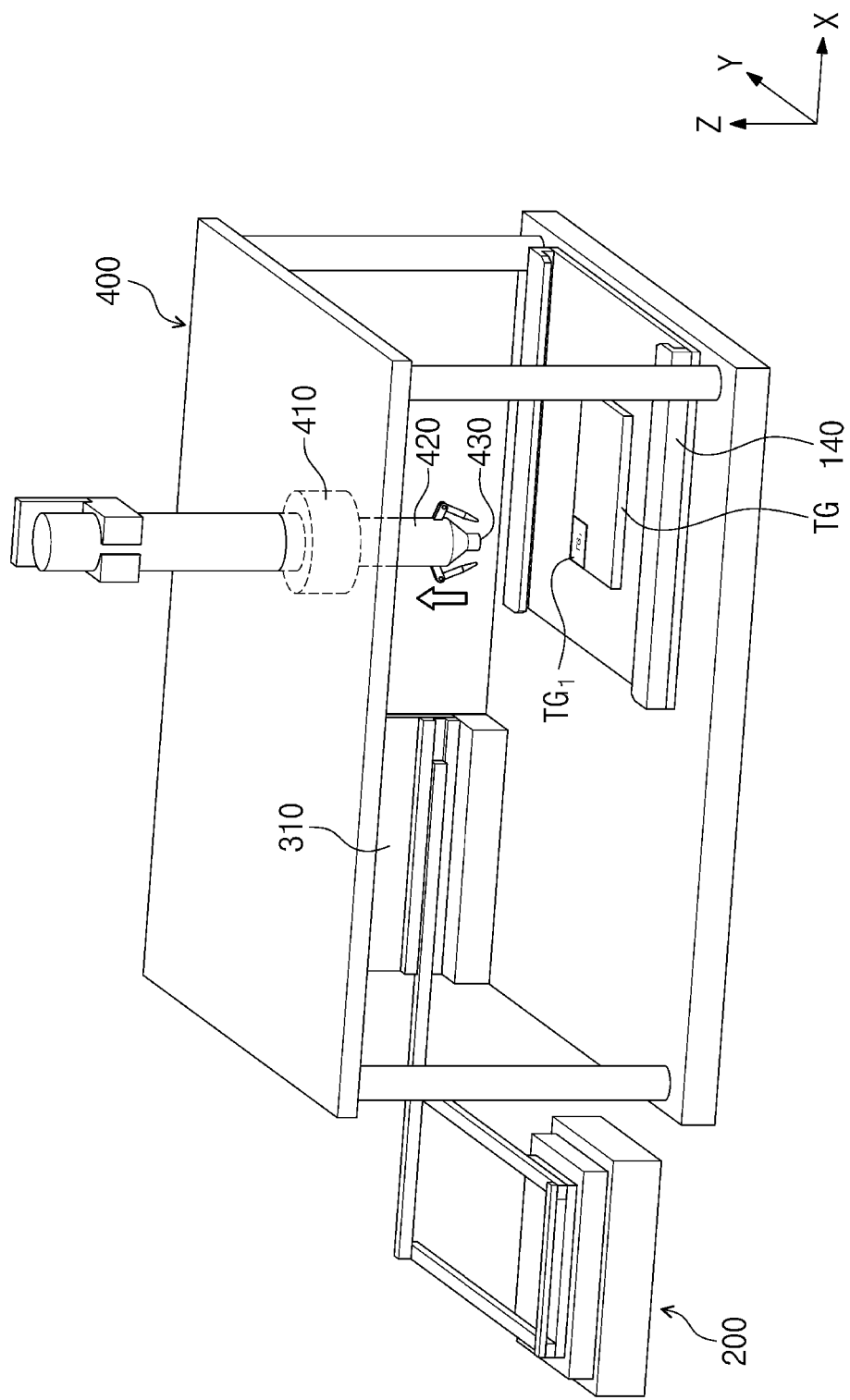
FIG. 22 is a perspective view of the patterning module included in the complex patterning device according to the second modification of the present invention.

FIG. 21 is a side view of a patterning module included in a complex patterning device according to a second modification of the present invention. FIG. 22 is a perspective view of the patterning module included in the complex patterning device according to the second modification of the present invention.

Referring to FIGS. 21 and 22, the complex patterning device according to the second modification of the present invention may be the same as the complex patterning device according to the embodiment, except for the patterning module 400. Accordingly, a detailed description of the same configuration will be omitted.

The patterning module 400 included in the complex patterning device according to the second modification may include a support member 410, a ram head 420, a bridge B, and a light source L. According to the embodiment, the bridge B may be connected to one side of the ram head 420. The light source L may be disposed at one end of the bridge B. That is, the light source L may be disposed at one end of the bridge B, and an opposite end of the bridge B may be connected to one side of the ram head 420. The light source L may be a laser irradiation device.

The laser irradiated from the light source L may be provided to a specific area on the target substrate TG. In detail, as in the light source L included in the patterning module according to the first modification described with reference to FIG. 20, laser may be provided onto a specific area in which the target pattern $TG_p$ is formed. The laser also may cure the target pattern $TG_p$.

As a result, after the target pattern $TG_p$ is formed on a specific area on the target substrate TG, the patterning device according to the second modification also may cure the formed target pattern $TG_p$ through laser. Accordingly, while the plurality of target patterns $TG_p$ are formed on the target substrate TG, a damage to the target patterns $TG_p$ formed in advance can be prevented and the reliability of the formation of the target patterns can be enhanced.

According to the embodiment, the angle of the bridge B may be controlled. Further, rotation of the ram head 420 may be controlled. Accordingly, the laser irradiated through the light source may be easily irradiated to a specific area of the target pattern $TG_p$.

According to the embodiment, the laser irradiated from the light source L may be provided to interfaces of the plurality of target areas. Accordingly, the target substrate TG also may be divided. That is, the target substrate in which a target pattern is formed through the patterning module 400 may be divided through the light source L while not passing through the punching module 500.

Complex Patterning Device According to Third Modification

The complex patterning device according to the third modification of the present invention may be the same as the complex patterning device according to the embodiment, except for the patterning module 400. Accordingly, a detailed description of the same configuration will be omitted.

The patterning module according to the third modification may include a support member (not illustrated), a ram head (not illustrated), and a coil (not illustrated). That is, the patterning module according to the third modification may further include a coil as compared with the patterning module described above.

According to the embodiment, the coil may be disposed on an area of an outer peripheral surface of the ram head. In detail, the coil may be disposed around one end of the ram head in which the master substrate is disposed. According to another embodiment, the coil may be disposed on an area in the interior of the ram head. In detail, the coil may be disposed in an area in the vicinity of the interior of one end of the ram head in which the master substrate is disposed.

The coil may heat-treat one end of the ram head. When one end of the ram head is heat-treated, the master substrate disposed at one end of the ram head also may be heat-treated. Accordingly, in a state in which the master substrate is heat-treated, the target pattern may be formed. In this case, as compared with a case in which the target pattern is formed without heat-treating the master substrate, the efficiency of forming the target pattern can be enhanced.

Complex Patterning Device According to Fourth Modification

The complex patterning device according to the fourth modification of the present invention may be the same as the configurations of the complex patterning device according to the above embodiment. Accordingly, a detailed description of the same configuration will be omitted.

The patterning module included in the complex patterning device according to the fourth modification may form a potential difference in the master substrate (not illustrated) and the target substrate (not illustrated) in a state in which the master substrate and the target substrate contact each other. As a detailed example, a (+) voltage may be applied to the master substrate in a state in which the master substrate and the target substrate contact each other. In this case, a polarization phenomenon may occur in the target substrate in contact with the master substrate, to which the (+) voltage has been applied. In detail, the target pattern part formed while contacting the master substrate may be charged to (−), and a lower part of the target substrate, which is opposite to the target pattern, may be charged to (+).

As a result, the target substrate including the target pattern and polarized may be manufactured. The target substrate including the target pattern and polarized may be used as a piezoelectric material. That is, the patterning module according to the fourth modification may easily manufacture the target substrate used as a piezoelectric material through a simple method of generating a potential difference between the master substrate and the target substrate by applying a voltage to the master substrate in a state in which the master substrate and the target substrate contact each other.

Complex Patterning Device According to Fifth Modification

Figure 23:
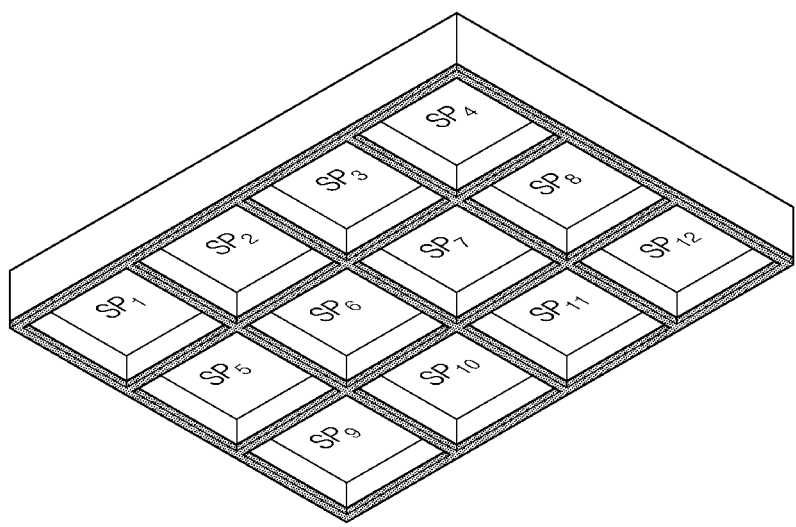
FIGS. 23 and 24 are views of a punching mold included in a complex patterning device according to a fifth modification of the present invention.
Figure 24:
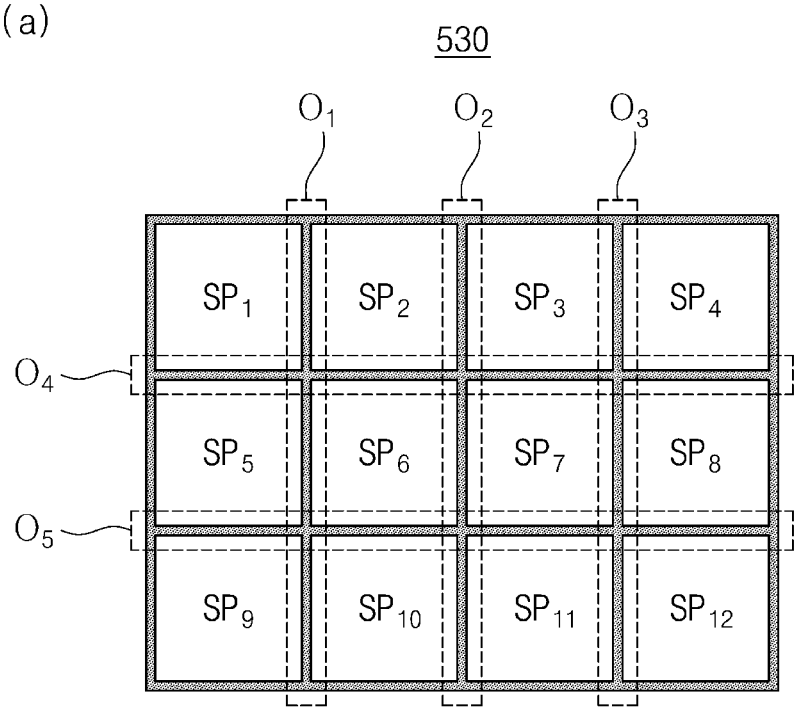
Figure 24:
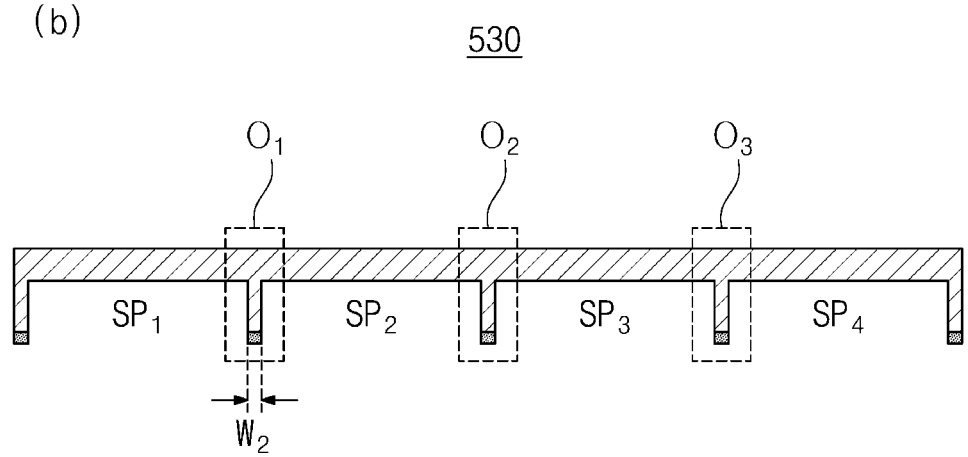
Figure 25:
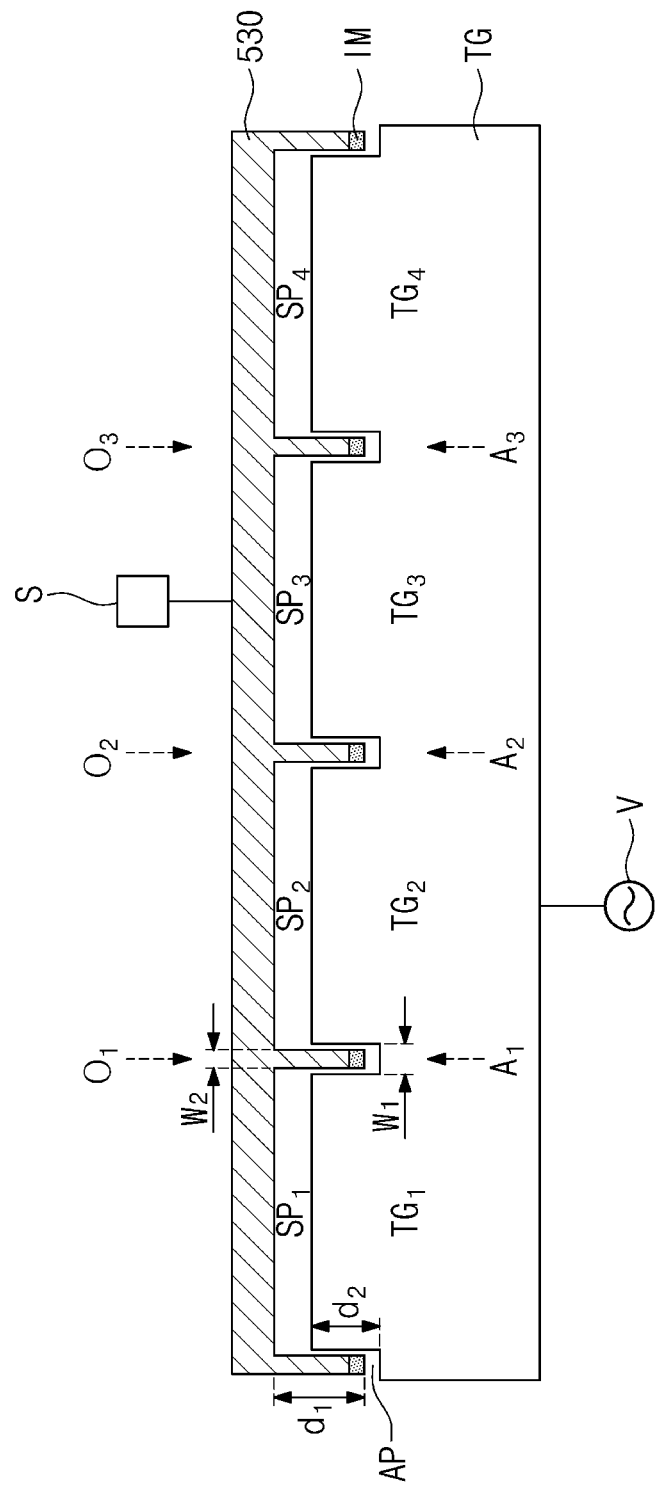
FIG. 25 is a view of a punching process through a punching module included in the complex patterning device according to a fifth modification of the present invention.

FIGS. 23 and 24 are views of a punching mold included in a complex patterning device according to a fifth modification of the present invention. FIG. 25 is a view of a punching process through a punching module included in the complex patterning device according to a fifth modification of the present invention.

Referring to FIGS. 23 and 25, the complex patterning device according to the fifth modification of the present invention may be the same as the complex patterning device according to the embodiment, except for the punching module 500. Accordingly, a detailed description of the same configuration will be omitted. Further, the punching module 500 according to the fifth modification may further include a voltmeter V connected to the target substrate TG, and a sensor S connected to the punching mold 530. The sensor S may detect flow of a current. Hereinafter, the target substrate and the punching mold of the punching device according to the fifth modification will be mainly described in detail.

The punching mold 530 may further include an insulation material IM. According to the embodiment, the insulation material IM may be disposed on an area of the punching mold 530, except for the plurality of sink patterns. That is, the insulation material IM may be disposed in the first to fifth cutter parts $O_1$ to $O_5$, and an outskirt area of the punching mold 530.

When the punching mold 530 and the target substrate TG contact each other, the first to fifth cutter parts $O_1$ to $O_5$ may be inserted into the grooves formed in the first to fifth division areas $A_1$ to $A_5$. Hereinafter, a case in which the first to third cutter parts $O_1$ to $O_5$ are inserted into the grooves formed in the first to third division areas $A_1$ to $A_3$ will be described as an example.

According to the embodiment, the width $W_1$ of the grooves formed in the first to third division areas $A_1$ to $A_3$ may be larger than the width $W_2$ of the f the first to third cutter parts $O_1$ to $O_3$. Accordingly, when the first to third cutter parts $O_1$ to $O_3$ are inserted into the grooves formed in the first to third division areas $A_1$ to $A_3$, the side walls of the first to third cutter parts $O_1$ to $O_3$ may not contact the target substrate.

Further, a distance $d_1$ from the sink pattern to the insulation material may be more distant than a distance $d_2$ from the lower surface of the alignment pattern (AP) to the upper surface of the target substrate TG. Accordingly, when the first to third cutter parts $O_1$ to $O_3$ are inserted into the grooves GV formed in the first to third division areas $A_1$ to $A_3$, the sink patterns may not contact the target substrate TG. As a result, the target substrate TG may contact the punching mold 530 through the insulation material IM.

As mentioned above, when the target substrate TG contacts the punching mold 530 through the insulation material IM, a current may not flow between the target substrate TG and the insulation material IM. Accordingly, when a voltage is applied though the voltmeter V in a state in which the target substrate TG and the punching mold 530 contact each other, the sensor S may not detect the flow of the current. As a result, when the sensor S does not detect the flow of a current after a voltage is applied to the target substrate TG in a state in which the target substrate TG and the punching mold 530 contact each other, it may be determined that the alignment of the target substrate TG and the punching mold 530 are made appropriately.

Unlike this, when the alignment of the target substrate TG and the punching mold 530 are not made appropriately, the side walls of the first to third cutter parts $O_1$ to $O_3$ may contact the target substrate TG in a process of inserting the first to third cutter parts $O_1$ to $O_3$ into the grooves GV formed in the first to third division areas $A_1$ to $A_3$. Accordingly, a current may flow between the punching mold 530 and the target substrate TG. As a result, when the sensor S detects the flow of a current after a voltage is applied to the target substrate TG in a state in which the target substrate TG and the punching mold 530 contact each other, it may be determined that the alignment of the target substrate TG and the punching mold 530 are not made appropriately. In this case, the process of dividing a target pattern may be performed after the target substrate TG and the punching mold 530 are aligned again in a state in which flow of a current is not detected between the target substrate TG and the punching mold 530.

That is, the punching device according to the fifth modification of the present invention can identify an alignment of the target substrate TG and the punching mold 530 by bringing the target substrate TG and the punching mold 530 into contact with each other, applying a voltage to any one of the target substrate TG and the punching mold 530, and measuring a current flowing between the target substrate TG and the punching mold 530. Accordingly, in the process of dividing the target pattern, the loss rate of the target pattern can be reduced.

Complex Patterning Device According to Sixth Modification

Figure 26:
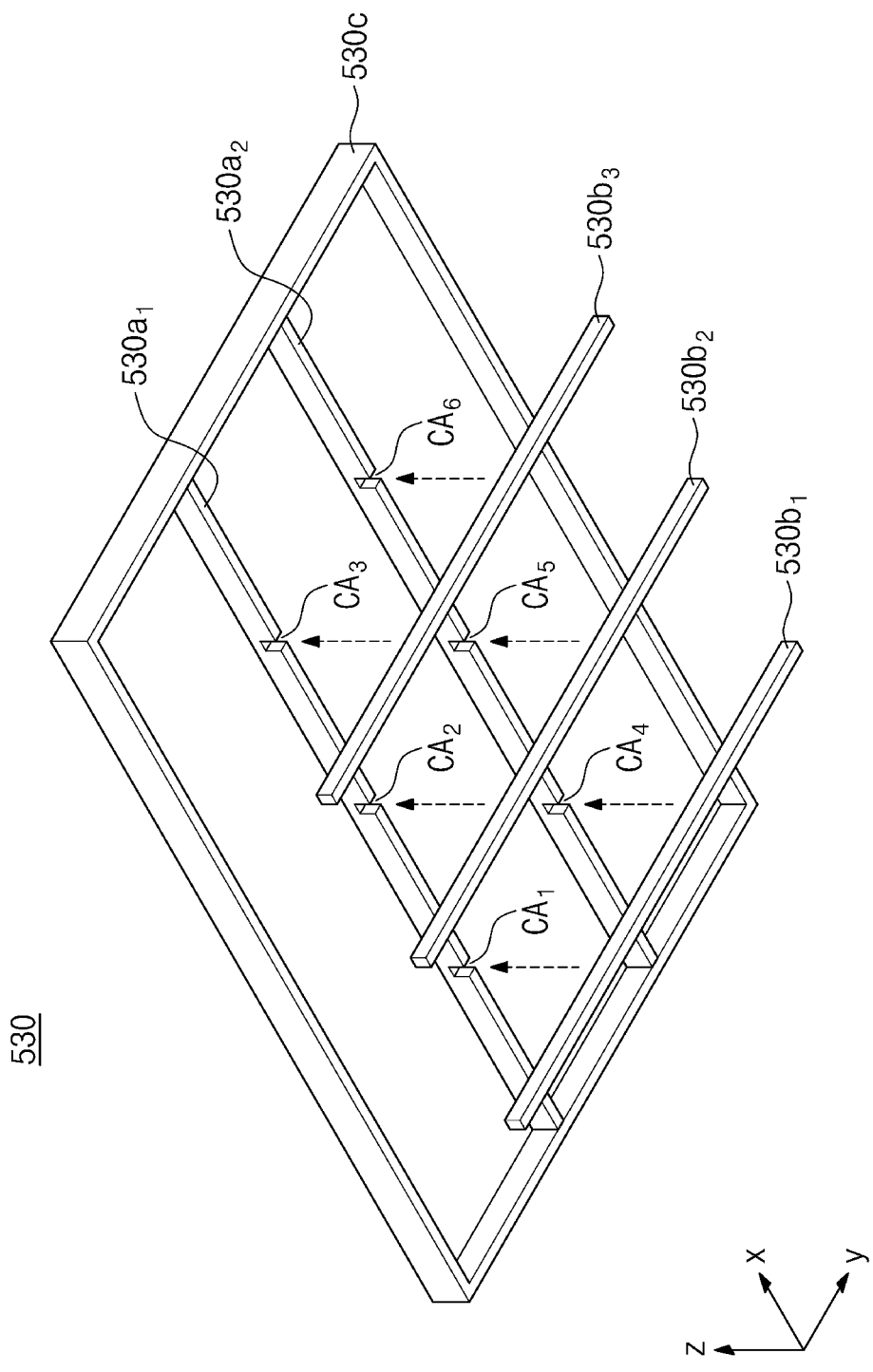
FIGS. 26 to 28 are views of a punching mold included in a complex patterning device according to a sixth modification of the present invention.
Figure 27:
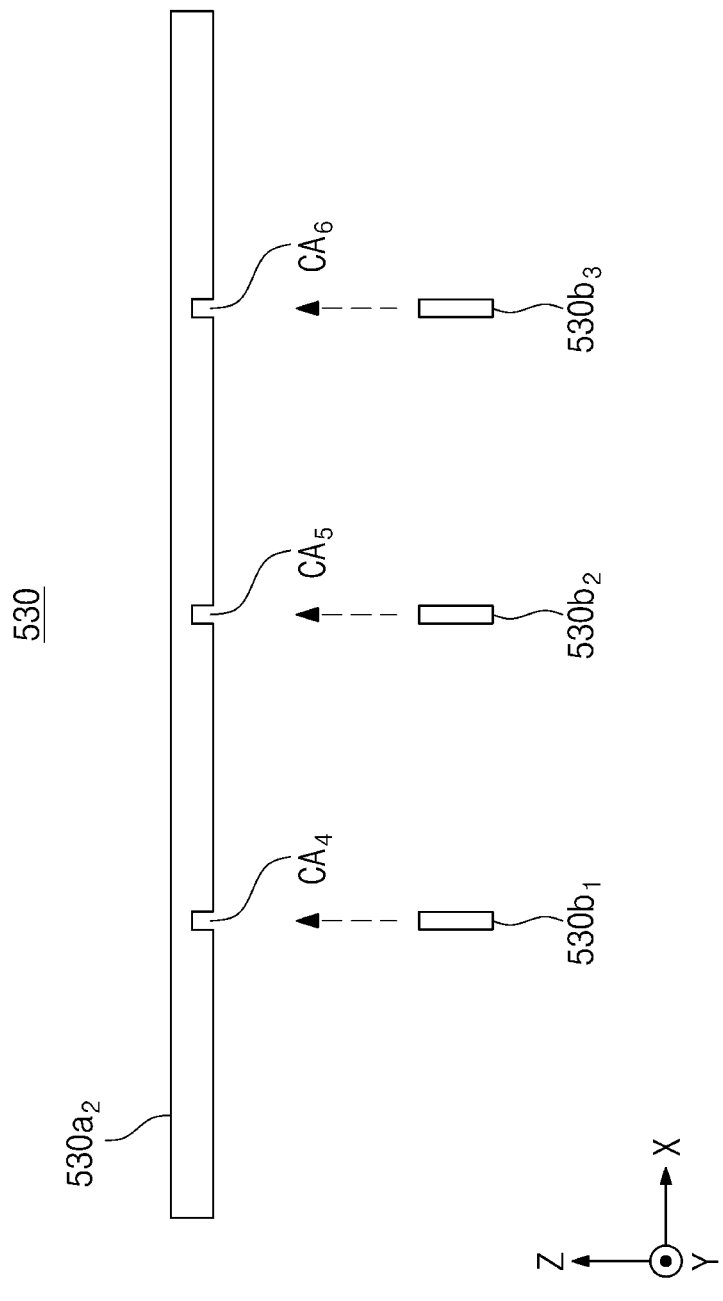
Figure 28:
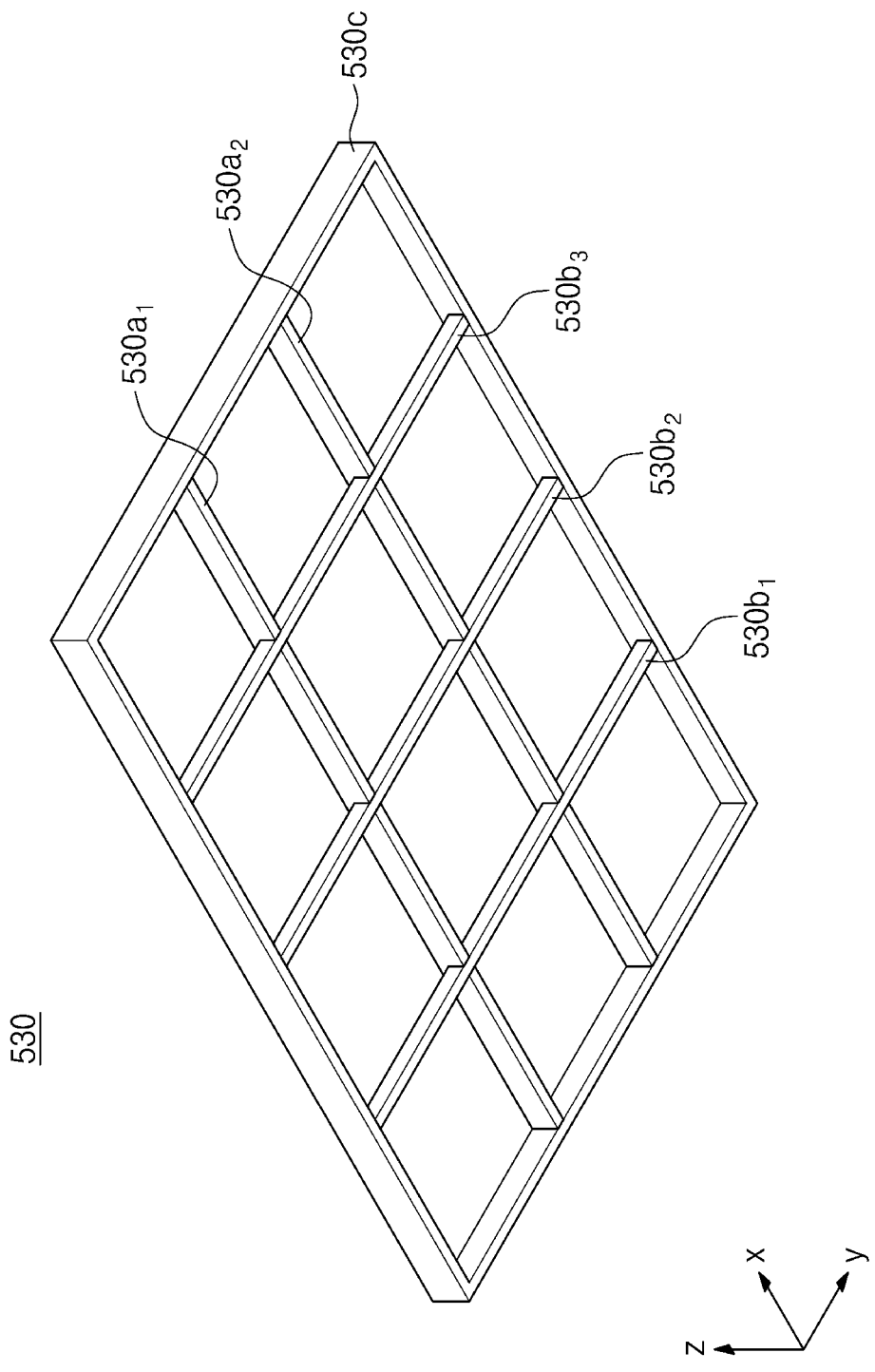
Figure 29:
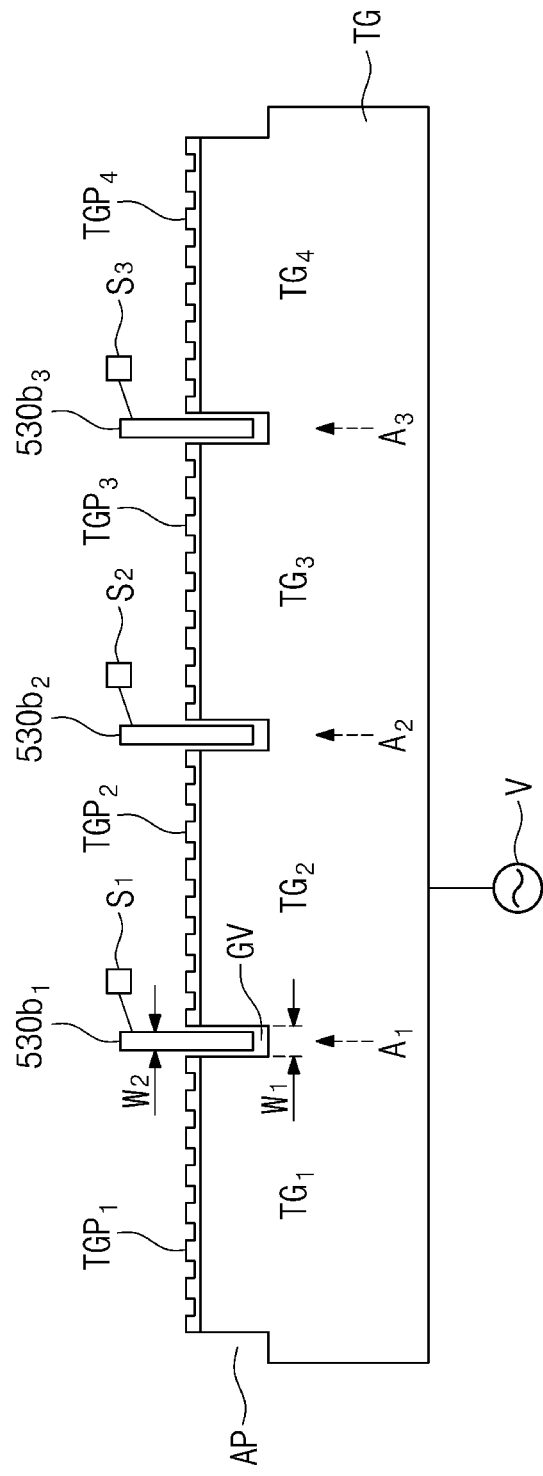
FIG. 29 is a view of a punching process through a punching module included in the complex patterning device according to the sixth modification of the present invention.
Figure 30:
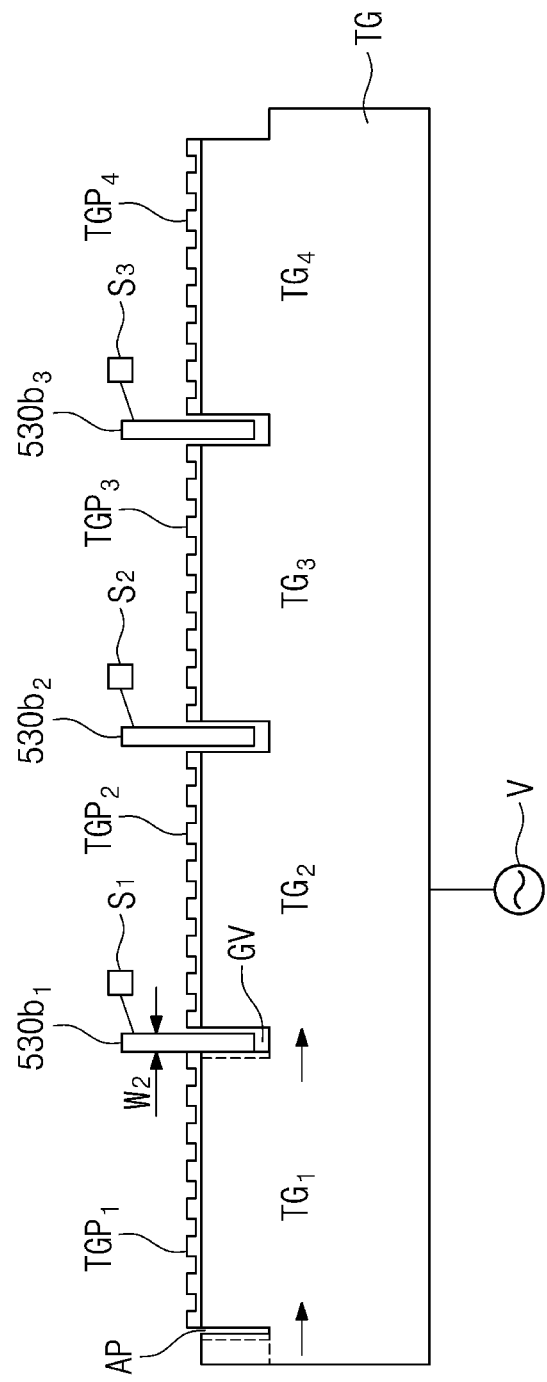
FIG. 30 is a view explaining a case in which misalignment occurs during an operation process of the punching module included in the complex patterning device according to the sixth modification of the present invention.

FIGS. 26 to 28 are views of a punching mold included in a complex patterning device according to a sixth modification of the present invention. FIG. 29 is a view of a punching process through a punching module included in the complex patterning device according to the sixth modification of the present invention. FIG. 30 is a view explaining a case in which misalignment occurs during an operation process of the punching module included in the complex patterning device according to the sixth modification of the present invention.

Referring to FIGS. 26 and 29, the complex patterning device according to the sixth modification of the present invention may be the same as the complex patterning device according to the embodiment, except for the punching module 500. Accordingly, a detailed description of the same configuration will be omitted. Further, the punching device according to the sixth modification may further include a voltmeter V connected to the target substrate TG. Hereinafter, the punching mold of the punching device according to the sixth modification will be mainly described in detail.

The punching mold 530 may include a plurality of frames. According to the embodiment, the punching mold 530 may include a 1-1-th frame $530a_1$, a 1-2-th frame $530a_2$, a 2-1-th frame $530b_1$, a 2-2-th frame $530b_2$, a 2-3-th frame $530b_3$, and an outskirt frame $530c$. The 1-1-th frame $530a_1$ and the 1-2-th frame $530a_2$ may extend in the first direction (X-axis). The 1-1-th frame $530a_1$ and the 1-2-th frame $530a_2$ may be spaced apart from each other and may be coupled to the outskirt frame $530c$.

Each of the 1-1-th frame $530a_1$ and the 1-2-th frame $530a_2$ may include a plurality of coupling areas CA. For example, the 1-1-th frame $530a_1$ may include a 1-1-th coupling area $CA_1$, a 1-2-th coupling area CA2, and a 1-3-th coupling area $CA_3$. For example, the 1-1-th coupling area $CA_1$, the 1-2-th coupling area $CA_2$, and the 1-3-th coupling area $CA_3$ of the 1-1-th frame $530a_1$ may be disposed to be spaced apart from each other. For example, the 1-2-th frame $530a_2$ may include a 2-1-th coupling area $CA_4$, a 2-2-th coupling area $CA_5$, and a 2-3-th coupling area $CA_6$. The 2-1-th coupling area $CA_4$, the 2-2-th coupling area $CA_5$, and the 2-3-th coupling area $CA_6$ may be disposed to be spaced apart from each other.

The 2-1-th frame $530b_1$, the 2-2-th frame 530b2, and the 2-3-th frame $530b_3$ may extend in the second direction (Y-axis). The second direction may be a direction that is perpendicular to the first direction. The 2-1-th frame $530b_1$, the 2-2-th frame 530b2, and the 2-3-th frame $530b_3$ may be coupled to the plurality of coupling areas $CA_1$, $CA_2$, and $CA_3$ included in the 1-1-th frame $530a_1$, respectively. Further, the 2-1-th frame $530b_1$, the 2-2-th frame 530b2, and the 2-3-th frame $530b_3$ may be coupled to the plurality of coupling areas $CA_4$, $CA_5$, and $CA_6$ included in the 1-2-th frame $530a_2$ respectively.

In detail, the 2-1-th frame $530b_1$ may be coupled to the 1-1-th and 1-2-th frames $530a_1$ and $530a_2$ through the 1-1-th coupling area $CA_1$ and the 2-1-th coupling area $CA_4$. The 2-2-th frame 530b2 may be coupled to the 1-2-th and 1-2-th frames $530a_1$ and $530a_2$ through the 1-2-th coupling area $CA_2$ and the 2-2-th coupling area $CA_5$. The 2-3-th frame $530b_3$ may be coupled to the 1-1-th and 1-2-th frames $530a_1$ and $530a_2$ through the 1-3-th coupling area $CA_3$ and the 2-3-th coupling area $CA_6$.

According to the embodiment, an insulation material may be disposed in the interiors of the 1-1-th to 1-3-th coupling areas $CA_1$, $CA_2$, and $CA_3$ and the 2-1-th to 2-3-th coupling areas $CA_4$, $CA_5$, and $CA_6$. Accordingly, the 2-1-th to 2-3-th frames $530b_1$, $530b_2$, and $530b_3$ and the 1-1-th and 1-2-th frames $530a_1$ and $530a_2$ may be insulated from each other. Further, the 2-1-th to 2-3-th frames $530b_1$, $530b_2$, and $530b_3$ may be insulated from each other. Further, the 1-1-th frame $530a_1$ and the 1-2-th frame $530a_2$ may be insulated from each other. That is, currents may flow individually through the 1-1-th frame $530a_1$, the 1-2-th frame $530a_2$, the 2-1-th frame $530b_1$, the 2-2-th frame $530b_2$, and the 2-3-th frame $530b_3$.

According to the embodiment, the first to fifth sensors S1 to S5 may be connected to the 1-1-th frame $530a_1$, the 1-2-th frame $530a_2$, the 2-1-th frame $530b_1$, the 2-2-th frame $530b_2$, and the 2-3-th frame $530b_3$, respectively. The first to fifth sensors S1 to S5 may detect the current flowing respectively through the 1-1-th frame $530a_1$, the 1-2-th frame $530a_2$, the 2-1-th frame $530b_1$, the 2-2-th frame $530b_2$, and the 2-3-th frame $530b_3$.

When the target substrate TG and the punching mold 530 contact each other, the 2-1-th frame $530b_1$, the 2-2-th frame $530b_2$, the 2-3-th frame $530b_3$, the 1-1-th frame $530a_1$, and the 1-2-th frame $530a_2$ may be inserted respectively into the grooves GV formed in the first to fifth division areas $A_1$ to $A_5$. Hereinafter, a case in which the 2-1-th frame $530b_1$, the 2-2-th frame $530b_2$, and the 2-3-th frame $530b_3$ are inserted into the grooves GV formed in the first to third division areas $A_1$ to $A_3$ will be described as an example.

According to the embodiment, the width $W_1$ of the grooves formed in the first to third division areas $A_1$ to $A_3$ may be larger than the width $W_2$ of the 2-1-th frame $530b_1$, the 2-2-th frame $530b_2$, and the 2-3-th frame $530b_3$. Accordingly, when the 2-1-th frame $530b_1$, the 2-2-th frame $530b_2$, and the 2-3-th frame $530b_3$ are inserted into the grooves formed in the first to third division areas $A_1$ to $A_3$, the side walls of the 2-1-th frame $530b_1$, the 2-2-th frame $530b_2$, and the 2-3-th frame $530b_3$ may not contact the target substrate TG.

According to the embodiment, a process of identifying an alignment between the target substrate TG and the punching mold 530 may be performed before the target substrate TG and the punching mold 530 contact each other. In detail, before the target substrate TG and the punching mold 530 contact each other, portions of the 2-1-th frame $530b_1$, the 2-2-th frame $530b_2$, and the 2-3-th frame $530b_3$ may be inserted into the grooves GV formed in the first to third division areas $A_1$ to $A_3$. That is, ends of the 2-1-th frame $530b_1$, the 2-2-th frame $530b_2$, and the 2-3-th frame $530b_3$ may be inserted until contacting the lower surfaces of the grooves GV formed in the first to third division areas $A_1$ to $A_3$.

In this state, when a voltage is applied to the target substrate TG through the voltmeter V, flow of a current may not be detected in the first to third sensors S1, S2, and S3 as the target substrate TG and the punching mold 530 do not contact each other. As a result, when flow of a current is not detected in the first to third sensors S1, S2, and S3 after a voltage is applied to the target substrate TG in a state in which portions of the 2-1-th frame $530b_1$, the 2-2-th frame $530b_2$, and the 2-3-th frame $530b_3$ are inserted into the grooves GV formed in the first to third division areas $A_1$ to $A_3$, it may be determined that the alignment of the target substrate TG and the punching mold 530 are made appropriately.

Unlike this, referring to FIG. 30, the target pattern included in the target substrate TG and the alignment pattern may be formed in different areas that are different from the above-mentioned target pattern and the alignment pattern. For example, as illustrated in FIG. 30, the first target pattern $TG_{p1}$ and the alignment pattern AP around the first target pattern $TG_{p1}$ may be famed in different areas, as compared with the first target pattern $TG_{p1}$ and the alignment pattern AP around the first target pattern $TG_{p1}$ illustrated in FIG. 29. In detail, the first target pattern $TG_{p1}$ may be formed after being moved toward the second target pattern $TG_{p2}$.

In this case, the side wall of the 2-1-th frame $530b_1$ may contact the target substrate TG in a process of inserting portions of the 2-1-th frame $530b_1$, the 2-2-th frame $530b_2$, and the 2-3-th frame $530b_3$ into the grooves GV formed in the first to third division areas $A_1$ to $A_3$. Accordingly, a current may flow between the target substrate TG and the 2-1-th frame $530b_1$. As a result, when flow of a current is detected by the first sensor S1 after a voltage is applied to the target substrate TG in a state a portion of the 2-1-th frame $530b_1$ is inserted into the groove GV formed in the first division area A1, it may be determined that the alignment of the target substrate TG and the 2-1-th frame $530b_1$ is not made appropriately. Further, it may be determined that an error is generated in a process of forming any one of the target patterns around the 2-1-th frame $530b_1$.

In addition, as mentioned above, currents may flow individually through the 1-1-th frame $530a_1$, the 1-2-th frame $530a_2$, the 2-1-th frame $530b_1$, the 2-2-th frame $530b_2$, and the 2-3-th frame $530b_3$. Accordingly, the first to fifth sensors S1 to S5 may detect the currents flowing respectively through the 1-1-th frame $530a_1$, the 1-2-th frame $530a_2$, the 2-1-th frame $530b_1$, the 2-2-th frame $530b_2$, and the 2-3-th frame $530b_3$ while distinguishing them. As a result, the alignment in the 1-1-th frame $530a_1$, the 1-2-th frame $530a_2$, the 2-1-th frame $530b_1$, the 2-2-th frame $530b_2$, and the 2-3-th frame $530b_3$, and an error of the surrounding target patterns can be identified. Accordingly, a location at which the alignment is wrongly made in the process of dividing the pattern can be recognized in more detail.

Complex Patterning Device According to Seventh Modification

Figure 31:
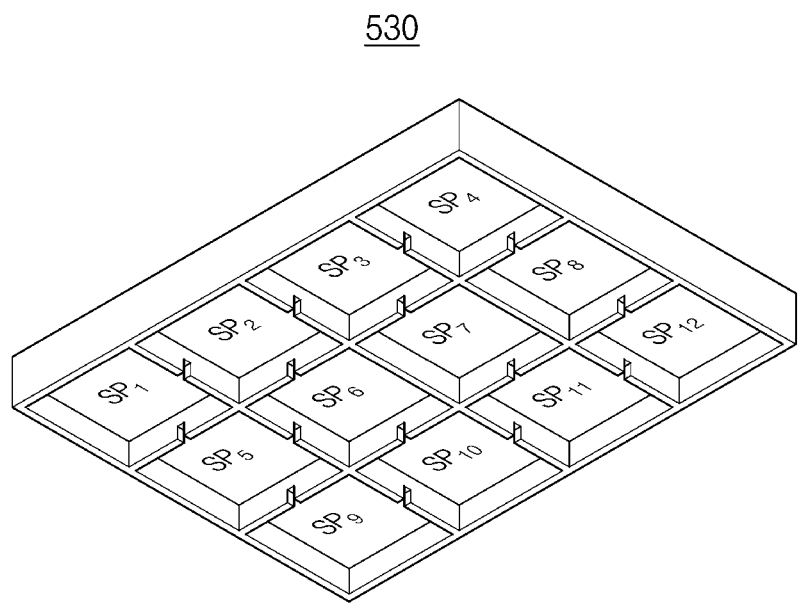
FIG. 31 is a view illustrating a punching mold included in a punching module according to a seventh modification of the present invention.
Figure 32:
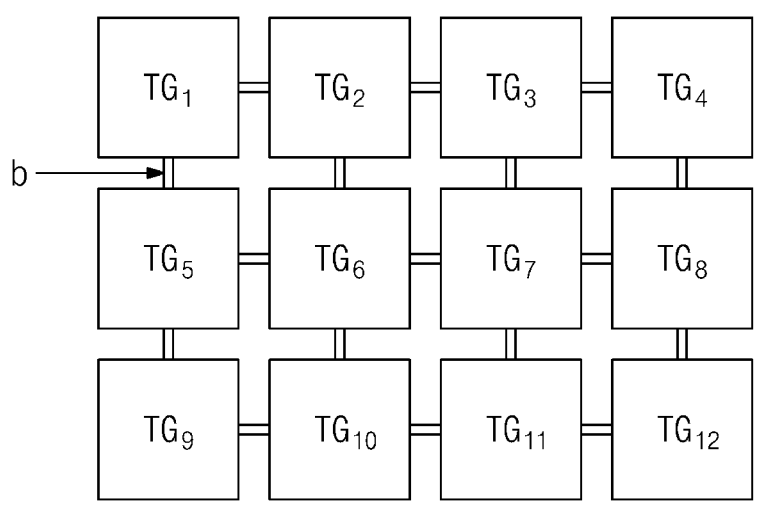
FIG. 32 is a view illustrating a target substrate punched through a punching device according to the seventh modification of the present invention.

FIG. 31 is a view illustrating a punching mold included in a punching module according to a seventh modification of the present invention. FIG. 32 is a view illustrating a target substrate punched through a punching device according to the seventh modification of the present invention.

Referring to FIGS. 31 and 32, the complex patterning device according to the seventh modification of the present invention may be the same as the complex patterning device according to the embodiment, except for the punching module 500. Accordingly, a detailed description of the same configuration will be omitted.

The punching mold 530 may include a plurality of sink patterns, and grooves may be formed between the sink patterns. For example, as illustrated in FIG. 31, a groove may be formed between a first sink pattern SP1 and a second sink pattern SP2. Further, a groove also may be formed between the first sink pattern SP1 and a fifth sink pattern SP5.

Accordingly, when the target substrate TG is punched through the punching mold 530, the plurality of target areas $TG_1$ to $TG_{12}$ included in the target substrate TG are divided, and bridges b may be formed between the target areas. That is, the plurality of target areas $TG_1$ to $TG_{12}$ are divided, and the adjacent target areas may be connected to each other through the bridges b.

Complex Patterning Device According to Eighth Modification

Figure 33:
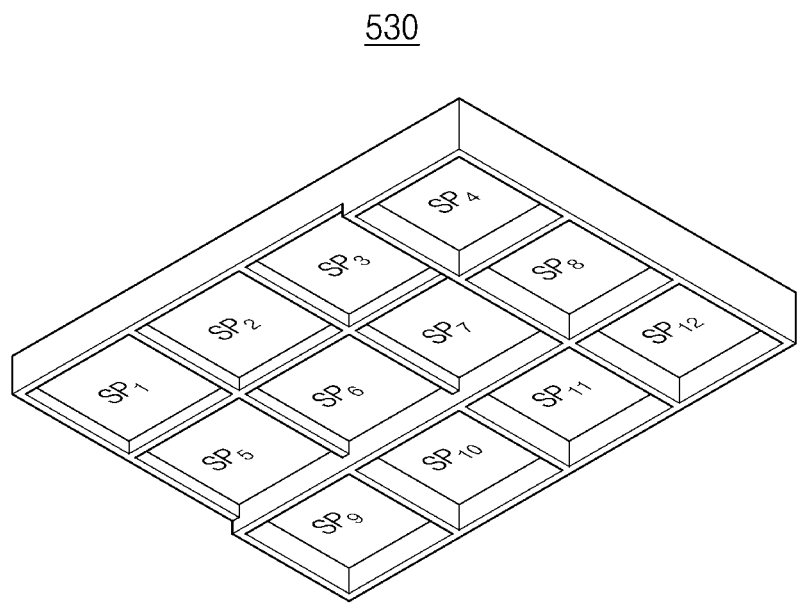
FIG. 33 is a view illustrating a punching mold included in a punching module according to an eighth modification of the present invention.
Figure 34:
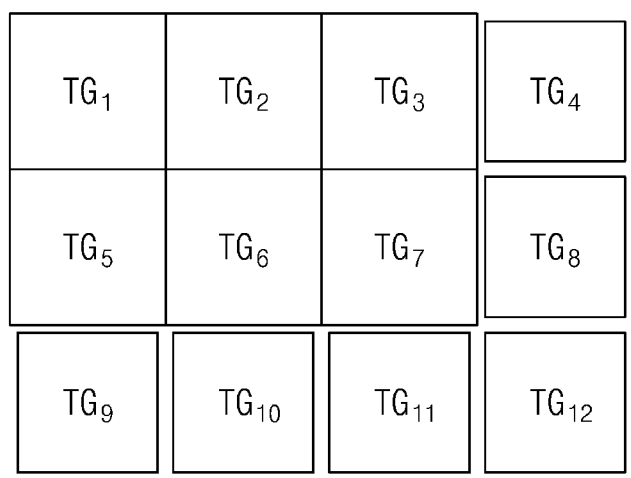

FIG. 33 is a view illustrating a punching mold included in a punching module according to an eighth modification of the present invention. FIGS. 34 and 35 are views illustrating a target substrate punched through a punching device according to the eighth modification of the present invention.

Referring to FIGS. 33 to 35, the punching mold 530 includes a plurality of sink patterns, and the levels of the cutter parts (not indicated) formed between the sink patterns may be different. For example, as illustrated in FIG. 33, the levels of the cutter parts around a first sink pattern SP1, a second sink pattern SP2, a third sink pattern SP3, a fifth sink pattern SP5, a sixth sink pattern SP6, and a seventh sink pattern SP7 may be lower than the levels of a fourth sink pattern SP4, an eighth sink pattern SP8, a ninth sink pattern SP9, a tenth sink pattern SP10, an eleventh sink pattern SP11, and a twelfth sink pattern SP12.

Accordingly, when the target substrate TG is punched through the punching mold 530, an area of the plurality of target areas $TG_1$ to $TG_{12}$ included in the target substrate TG are divided, and the other areas, except for the area, may not be divided. For example, as illustrated in FIG. 34, the first target area $TG_1$, the second target area $TG_2$, the fifth target area $TG_5$, the sixth target area $TG_6$, and the seventh target area $TG_7$ may not be divided. Meanwhile, the fourth target area $TG_4$, the eighth target area $TG_8$, the ninth target area $TG_9$, the tenth target area $TG_{10}$, the eleventh target area $TG_{11}$, and the twelfth target area $TG_{12}$ may be divided.

According to an embodiment, the punching mold may be rotated. For example, when the target substrate TG is punched in a state in which the punch mold described in FIG. 32 is rotated by 180°, as illustrated in FIG. 35, the sixth to eighth target areas $TG_6$, $TG_7$, and $TG_8$ and the tenth to twelfth target areas $TG_{10}$, $TG_{11}$, and $TG_{12}$ may not be divided. Meanwhile, the first to fourth target areas $TG_1$, $TG_2$, $TG_3$, and $TG_4$, the fifth target area $TG_5$, and the ninth target area $TG_9$ may be divided.

Complex Patterning Device According to Ninth Modification

Figure 36:
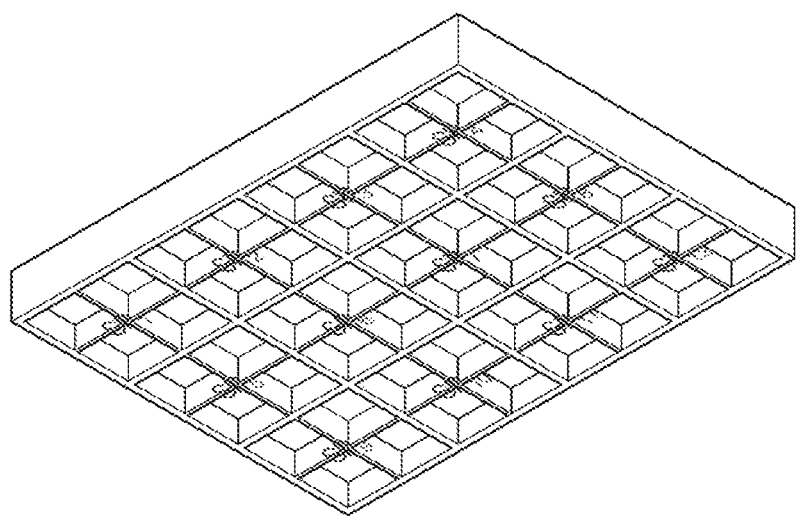
FIG. 36 is a view illustrating a punching mold included in a punching module according to a ninth modification of the present invention.
Figure 37:
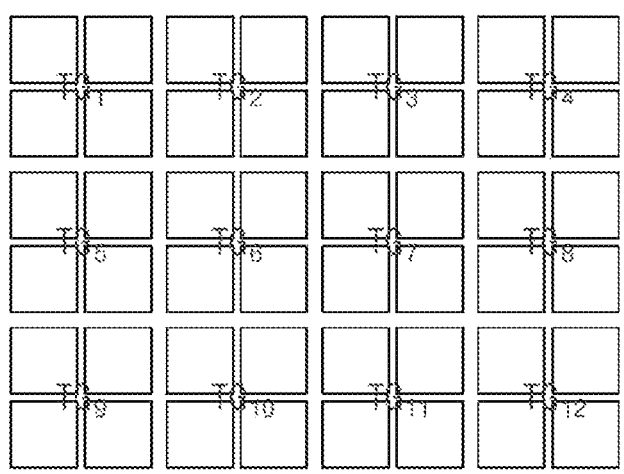
FIG. 37 is a view illustrating a target substrate punched through a punching device according to the ninth modification of the present invention.

FIG. 36 is a view illustrating a punching mold included in a punching module according to an ninth modification of the present invention. FIG. 37 is a view illustrating a target substrate punched through a punching device according to the ninth modification of the present invention.

Referring to FIGS. 36 and 37, the punching mold 530 includes a plurality of sink patterns, and each of the sink patterns may include a sub-bridge (not indicated). When the punching mold 530 and the target substrate TG contact each other, the sub-bridge (not indicated) also may contact the target substrate TG. Accordingly, the sub-bridges (not indicated) may provide pressures to the plurality of target areas $TG_1$ to $TG_{12}$. Accordingly, each of the target areas $TG_1$ to $TG_{12}$ also may be divided again. For example, as illustrated in FIG. 37, after the target substrate TG is divided into the first to twelfth areas $TG_1$ to $TG_{12}$ by the cutter parts of the punching mold 530, the target areas $TG_1$ to $TG_{12}$ may be divided again by the sub-bridges (not indicated).

Although the preferred embodiments of the present invention have been described in detail until now, the scope of the present invention is not limited to the embodiments and should be construed by the attached claims. Further, it should be understood that those skilled in the art to which the present invention pertains may variously correct and modify the present invention without departing from the scope of the present invention.

What is claimed is:

1. A complex patterning device comprising:
a patterning module that includes a ram head having a working surface, wherein:
the working surface of the ram head includes a master pattern and a marking pattern,
the master pattern is positioned at a central portion of the working surface of the ram head,
the marking pattern is positioned at a peripheral portion of the working surface of the ram head,
the master pattern is dimensioned such that applying the working surface of the ram head to a target substrate forms a plurality of target patterns having a reverse image of the master pattern on the target substrate, the target patterns penetrating to a first depth into the target substrate,
the marking pattern is dimensioned such that applying the working surface of the ram head to the target substrate forms an alignment pattern in the target substrate, the alignment pattern penetrating to a second depth $d_2$ into the target substrate, and the alignment pattern including a groove of width $W_1$ formed in the target substrate, and
the first depth is less than the second depth; and
a punching module including a punching mold having first and second sink patterns that are separated by an elongate cutter part that extends from a level of the first and second sink patterns to a distal cutter tip, wherein:
the elongate cutter part has a width $W_2$ that is less than the width $W_1$,
the elongate cutter part has an insulation material disposed at the distal cutter tip,
a distal end of the insulation material disposed at the distal cutter tip is positioned at a cutter depth $d_1$ from the level of the first and second sink patterns, and
the punching mold further includes a sensor configured to detect a voltage applied to the target substrate.

2. The complex patterning device of claim 1, wherein applying the working surface of the ram head to the target substrate causes the master pattern to contact the target substrate at a plurality of contact points.

3. The complex patterning device of claim 1, wherein the plurality of target patterns are arranged in a two-dimensional array of columns extending in a first direction and rows extending in a second direction that is different from the first direction.

4. The complex patterning device of claim 3, wherein the elongate cutter part includes a first cutter part extending in the first direction, and a second cutter part extending in the second direction.

5. The complex patterning device of claim 4, wherein applying the punching mold to the target substrate causes two of the target patterns to face the first and the second sink patterns.

6. The complex patterning device of claim 1, further comprising: a stage that is (a) movable in a first direction, and a second direction that is perpendicular to the first direction, and (b) dimensioned to receive the target substrate.

7. The complex patterning device of claim 6, wherein the target substrate is moved in the first direction and the second direction as the stage is moved.

8. The complex patterning device of claim 6, wherein the stage includes:
a first stage portion configured to hold the target substrate in the patterning module; and
a second stage configured to hold the target substrate in the punching module.

9. The complex patterning device of claim 1, wherein the master pattern has a hardness that is higher than a hardness of the target substrate, wherein the hardness of the master pattern and the hardness of the target substrate are measured by the same hardness standard.

* * * * *